(12) United States Patent
Salcedo et al.

(10) Patent No.: US 9,147,677 B2
(45) Date of Patent: Sep. 29, 2015

(54) DUAL-TUB JUNCTION-ISOLATED VOLTAGE CLAMP DEVICES FOR PROTECTING LOW VOLTAGE CIRCUITRY CONNECTED BETWEEN HIGH VOLTAGE INTERFACE PINS AND METHODS OF FORMING THE SAME

(71) Applicant: ANALOG DEVICES GLOBAL, Hamilton (BM)

(72) Inventors: Javier Alejandro Salcedo, North Billerica, MA (US); David J Clarke, Patrickswell (IE); Jonathan Glen Pfeifer, Summerville, NC (US)

(73) Assignee: ANALOG DEVICES GLOBAL, Hamilton (BM)

( * ) Notice: Subject to any disclaimer, the term of this patent is extended or adjusted under 35 U.S.C. 154(b) by 29 days.

(21) Appl. No.: 13/896,123

(22) Filed: May 16, 2013

(65) Prior Publication Data
US 2014/0339601 A1   Nov. 20, 2014

(51) Int. Cl.
*H01L 29/66* (2006.01)
*H01L 21/332* (2006.01)
(Continued)

(52) U.S. Cl.
CPC ........ *H01L 27/0262* (2013.01); *H01L 27/0817* (2013.01); *H01L 29/66121* (2013.01);
(Continued)

(58) Field of Classification Search
CPC ..... H01L 29/66; H01L 27/06; H01L 27/0248; H01L 27/0255; H01L 27/0262; H01L 27/027; H01L 27/067; H01L 27/0266; H02H 3/22
USPC ......... 257/140, 173, 546, 575, 355, 500, 544, 257/356
See application file for complete search history.

(56) References Cited

U.S. PATENT DOCUMENTS 3,436,667 A    4/1969   Leonard
4,633,283 A   12/1986   Avery
(Continued)

FOREIGN PATENT DOCUMENTS

DE   10 2007 040 875 A1   3/2009
EP        0 168 678 A2    1/1986
(Continued)

OTHER PUBLICATIONS

Salcedo et al., *On-Chip Protection for Automotive Integrated Circuits Robustness*, 2012 8th International Caribbean Conference on Devices, Circuits and Systems (ICCDCS), 5 pages, Mar. 2012.
(Continued)

*Primary Examiner* — Matthew Landau
*Assistant Examiner* — Eric Ashbahian
(74) *Attorney, Agent, or Firm* — Knobbe, Martens, Olson & Bear LLP

(57) ABSTRACT

Dual-tub junction-isolated voltage clamp devices and methods of forming the same are provided herein. The voltage clamp device can provide junction-isolated protection to low voltage circuitry connected between first and second high voltage interface pins. In certain implementations, a voltage clamp device includes a PNPN protection structure disposed in a p-well, a PN diode protection structure disposed in an n-well positioned adjacent the p-well, a p-type tub surrounding the p-well and the n-well, and an n-type tub surrounding the p-type tub. The p-type tub and the n-type tub provide junction isolation, the p-type tub can be electrically floating, and the n-type tub can be electrically connected to the second pin. The first and second pins can operate at a voltage difference below the junction isolation breakdown, and the second pin can operate with higher voltage than the first pin.

25 Claims, 21 Drawing Sheets

(51) Int. Cl.
*H01L 27/02* (2006.01)
*H01L 29/74* (2006.01)
*H01L 29/87* (2006.01)
*H01L 27/08* (2006.01)
*H01L 21/761* (2006.01)
*H01L 29/10* (2006.01)

(52) U.S. Cl.
CPC .......... *H01L29/7436* (2013.01); *H01L 29/87* (2013.01); *H01L 21/761* (2013.01); *H01L 27/027* (2013.01); *H01L 29/1083* (2013.01); *H01L 29/1087* (2013.01)

(56) References Cited

U.S. PATENT DOCUMENTS

| | | |
|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,652,689 A | 7/1997 | Yuan |
| 5,663,860 A | 9/1997 | Swonger |
| 5,742,084 A | 4/1998 | Yu |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,097,068 A * | 8/2000 | Brown et al. ............... 257/371 |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,768,616 B2 | 7/2004 | Mergens et al. |
| 6,870,202 B2 | 3/2005 | Oka |
| 6,960,792 B1 | 11/2005 | Nguyen |
| 7,034,363 B2 | 4/2006 | Chen |
| 7,038,280 B2 | 5/2006 | Righter |
| 7,071,528 B2 | 7/2006 | Ker et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,368,116 B2 | 2/2013 | Salcedo et al. |
| 8,432,651 B2 | 4/2013 | Salcedo et al. |
| 8,466,489 B2 | 6/2013 | Salcedo et al. |
| 2001/0040254 A1 | 11/2001 | Takiguchi |
| 2002/0021538 A1 | 2/2002 | Chen et al. |
| 2002/0109190 A1 | 8/2002 | Ker et al. |
| 2002/0122280 A1 | 9/2002 | Ker et al. |
| 2002/0187601 A1 | 12/2002 | Lee et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 * | 8/2008 | Xu et al. .................. 257/577 |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 * | 8/2011 | Ker et al. .................. 455/63.1 |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0211869 A1 * | 8/2012 | Lee et al. .................. 257/547 |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0242448 A1 | 9/2013 | Salcedo et al. |
| 2013/0270605 A1 | 10/2013 | Salcedo et al. |
| 2014/0138735 A1 * | 5/2014 | Clarke et al. .................. 257/124 |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Anderson et al., *ESD Protection under Wire Bonding Pads*, EOS/ESD SYMPOSIUM 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Salcedo et al., *Bidirectional Devices for Automotive-Grade Electrostatic Discharge Applications*, IEEE Electron Device Letters, vol. 33, No. 6, Jun. 2012, 3 pages.

* cited by examiner

DUAL-TUB JUNCTION-ISOLATED VOLTAGE CLAMP DEVICES FOR PROTECTING LOW VOLTAGE CIRCUITRY CONNECTED BETWEEN HIGH VOLTAGE INTERFACE PINS AND METHODS OF FORMING THE SAME

BACKGROUND

1. Field

Embodiments of the invention relate to electronic systems, and more particularly, to dual-tub junction-isolated voltage clamp devices for protecting low voltage circuits connected between high voltage interface pins.

2. Description of the Related Technology

Certain electronic systems can be exposed to a transient electrical event, or an electrical signal of a relatively short duration having rapidly changing voltage and high power. Transient electrical events can include, for example, electrical overstress/electrostatic discharge (EOS/ESD) events arising from the abrupt release of charge from an object or person to an electronic system.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC.

SUMMARY

In one embodiment, an apparatus for providing protection from transient electrical events is provided. The apparatus includes a first terminal, a second terminal, a first p-type well region, a first n-type well region adjacent the first p-type well region, a p-type tub configured to surround the first p-type well region and the first n-type well region, and an n-type tub configured to surround the p-type tub. The apparatus further includes a PNPN protection structure disposed in the first p-type well region, the PNPN protection structure including an anode electrically connected to the second terminal and a cathode electrically connected to the first terminal. The apparatus further includes a PN diode protection structure disposed in the first n-type well region, the PN diode protection structure including an anode electrically connected to the first terminal and a cathode electrically connected to the second terminal. The p-type tub is electrically floating, and the n-type tub is electrically connected to the second terminal.

In certain implementations, the apparatus further includes an embedded p-type guard well surrounding the n-type tub and an embedded n-type guard well surrounding the p-type guard well. Additionally, the embedded p-type guard well is electrically connected to the second terminal, and the n-type tub includes an n-type buried layer that extends beneath the embedded p-type guard well and the embedded n type guard well. In certain configurations, the embedded n-type guard well is electrically connected to the second terminal.

In another embodiment, a method of making a protection device is provided. The method includes forming a first p-type well region, forming a first n-type well region adjacent the first p-type well region, forming a p-type tub that surrounds the first p-type well region and the first n-type well region, and forming an n-type tub that surrounds the p-type tub. The method further includes forming a PNPN protection structure in the first p-type well region, the PNPN protection structure including a cathode electrically connected to a first terminal and an anode electrically connected to a second terminal. The method further includes forming a PN diode protection structure in the first n-type well region, the PN diode protection structure including an anode electrically connected to the first terminal and a cathode electrically connected to the second terminal. The p-type tub is electrically floating, and the n-type tub is electrically connected to the second terminal.

In certain implementations, the method further includes forming an embedded p-type guard well surrounding the n-type tub and forming an embedded n-type guard well surrounding the p-type guard well. The embedded p-type guard well is electrically connected to the second terminal, and the n-type tub includes an n-type buried layer that extends beneath the embedded p-type guard well and the embedded n-type guard well. In certain configurations, the embedded n-type guard well is electrically connected to the second terminal.

DETAILED DESCRIPTION OF EMBODIMENTS

Figure 1:
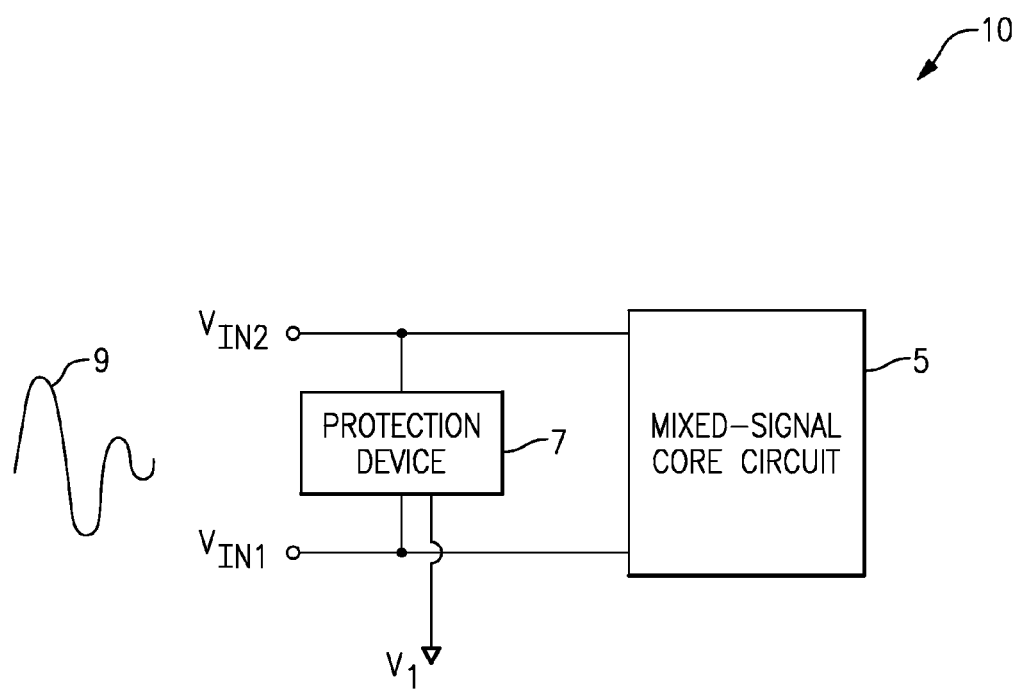
FIG. 1 is a schematic block diagram of one example of a mixed-signal electronic system.

The following detailed description of certain embodiments presents various descriptions of specific embodiments of the invention. However, the invention can be embodied in a multitude of different ways as defined and covered by the claims.

In this description, reference is made to the drawings where like reference numerals may indicate identical or functionally similar elements.

Certain electronic systems can include pins that operate with a high voltage relative to a ground or power low supply, but with a relatively small voltage difference during normal signaling conditions. For example, an electronic system can include two or more interface pins that operate with voltage levels near a maximum rated process voltage, such as a voltage of 60 V or more, but which operate normally with a relatively small voltage difference between one another, such as a voltage difference of less than about 5 V.

Conventional voltage clamp devices can prove unsuitable for providing protection between such pins. For example, an n-type metal oxide semiconductor (NMOS) transistor can be connected in a normally-off configuration to provide ESD/EOS protection between two pins, and can be fabricated in a p-well that is isolated from a p-type substrate using an n-type buried layer (NBL). However, a body-to-drain junction of the NMOS transistor can operate as a body diode, which can become forward-biased under certain operating conditions. The forward-biased body diode can provide a current that can reach the collector of a parasitic PNP bipolar transistor having an emitter associated with the p-type substrate, a base associated with the NBL, and a collector associated with the NMOS transistor's p-well. Activation of the parasitic PNP bipolar transistor can lead to high current conditions and unpredictable latch-up conditions in internal circuits fabricated in the p-type substrate with the NMOS transistor.

Accordingly, conventional voltage clamp devices, such as NMOS transistors and certain other NBL-isolated devices can undesirably activate parasitic PNP bipolar transistor structures during operation. The damage associated with activation of the parasitic PNP bipolar transistor structures can prove destructive even at relatively low current levels, as the base-to-collector voltage of the parasitic PNP bipolar transistors can be biased in certain instances near the process's maximum rated voltage, for instance, 60 V.

The danger of inadvertently activating parasitic PNP bipolar transistor structures can be mitigated by trial-and-error increases in spacing between core circuit blocks and voltage clamp devices. However, such an approach can result in unpredictable design iterations, additional IC die area increase, extra energy consumption due to leakage injection into the substrate, and/or additional development cost. Accordingly, there is a need for improved protection circuits, including, for example, protection circuits capable of providing protection to high voltage interface pins.

One Example of an Electronic System including a Dual-Tub Junction-Isolated Voltage Clamp Device FIG. 1 is a schematic block diagram of one example of a mixed-signal electronic system 10. The mixed-signal electronic system 10 includes a first pin or pad $V_{IN1}$, a second pin $V_{IN2}$, a mixed-signal core circuit 5, and a dual-tub junction-isolated voltage clamp device or protection device 7.

The mixed-signal core circuit 5 includes a first input electrically connected to the first pin $V_{IN1}$ and a second input electrically connected to the second pin $V_{IN2}$. The first and second pins $V_{IN1}$, $V_{IN2}$ can correspond to pins of an integrated circuit on which the mixed-signal core circuit 5 is fabricated. In certain configurations, one or more of the first and second pins $V_{IN1}$, $V_{IN2}$ can be used to transmit and/or receive signals to or from the mixed-signal core circuit 5.

Although the first and second pins $V_{IN1}$, $V_{IN2}$ can operate with controlled voltage levels during normal operation, a transient electrical event 9 having a voltage level in excess of normal operating levels can be received between the first and second pins $V_{IN1}$, $V_{IN2}$. The transient electrical event 9 can correspond to, for example, an ESD and/or EOS event, such as those described by standards set by the Joint Electronic Device Engineering Council (JEDEC), the International Electrotechnical Commission (IEC), and/or the International Organization for Standardization (ISO). The mixed-signal core circuit 5 can be particularly susceptible to damage in configurations in which the mixed-signal core circuit 5 is implemented using low voltage circuitry. For example, in certain configurations, the first and second pins $V_{IN1}$, $V_{IN2}$ are high voltage pins but operate with a relatively small voltage difference, and the mixed-signal core circuit 5 is implemented using low voltage circuitry electrically connected between the first and second pins $V_{IN1}$, $V_{IN2}$.

To provide protection to the mixed-signal core circuit 5 and/or other circuitry of the mixed-signal electronic system 10 from transient electrical events, the dual-tub junction-isolated voltage clamp device 7 has been included. The dual-tub junction-isolated voltage clamp device 7 includes a first terminal electrically connected to the first pin $V_{IN1}$, a second terminal electrically connected to the second pin $V_{IN2}$, and a bias terminal electrically connected to a first reference voltage $V_1$, which can be, for example, a power low or ground supply. The first reference voltage $V_1$ can be used as a voltage reference to, for example, bias a substrate on which the dual-tub junction-isolated voltage clamp device 7 is fabricated.

As will be described in detail below, the dual-tub junction-isolated voltage clamp device 7 can be configured to provide fine-tuned forward and reverse protection characteristics between the first and second pins $V_{IN1}$, $V_{IN2}$. Additionally, the dual-tub junction-isolated voltage clamp device 7 can include a dual-tub isolation structure including a p-type tub and an n-type tub. In certain configurations, the p-type tub is electrically floating or unbiased and the n-type tub is electrically connected to the second pin $V_{IN2}$. Connecting the dual-tub junction-isolated voltage clamp device 7 in this manner can help prevent activation of parasitic PNP bipolar transistors structures associated with the semiconductor layout of the dual-tub junction-isolated voltage clamp device 7, even when a voltage difference between the first pin $V_{IN1}$ and the first reference voltage $V_1$ and/or between the second pin $V_{IN2}$ and the first reference voltage $V_1$ is relatively large, such as 60 V or more.

In certain implementations, the first and second pins $V_{IN1}$, $V_{IN2}$ can correspond to signal pins, such as signal pins associated with a signaling interface. However, other configurations are possible. For example, in one embodiment, the first pin $V_{IN1}$ is a signal pin and the second pin $V_{IN2}$ is a high voltage power high supply pin, such as a power high supply pin configured to receive a supply voltage of 60 V or more. In certain implementations, the second pin $V_{IN2}$ is configured to have a higher operating voltage relative to the first pin $V_{IN1}$ during normal operation of the mixed-signal electronic system 10.

In one embodiment, the mixed-signal electronic system 10 corresponds to a battery control circuit, such as a battery control circuit of an electric vehicle or automobile. However, the teachings herein are applicable to other configurations of electronic systems, such as electronic systems including an integrated circuit (IC) implemented using a bipolar CMOS DMOS (BCD) process.

Various Examples of Dual-Tub Junction-Isolated Voltage Clamp Devices

Dual-tub junction-isolated voltage clamp devices and methods of forming the same are provided herein. In certain implementations, a dual-tub junction-isolated voltage clamp device includes a PNPN or thyristor protection structure and a PN diode protection structure electrically connected in parallel between a first pin and a second pin. The PNPN protection structure is disposed in a p-well, and the PN diode protection structure is disposed in an n-well that is positioned adjacent the p-well. The PNPN protection structure includes a cathode electrically connected to the first pin and an anode and an anode-gate electrically connected to second pin, and the PN diode protection structure includes an anode electrically connected to the first pin and a cathode electrically connected to the second pin. The voltage clamp device further includes a p-type isolation region or tub configured to surround the sides and bottom of the p-well and the n-well, and an n-type isolation region or tub configured to surround the sides and bottom of the p-type tub. In certain configurations, the p-type tub is configured to be electrically floating and the n-type tub is electrically connected to the second pin so as to provide the voltage clamp device with enhanced electrical isolation from a p-type substrate. For example, the dual-tub isolation structure can prevent the n-well and/or p-well and the structures therein from interacting with external components and circuitry. For instance, the dual-tub isolation structure can electrically float or disconnect a collector of a parasitic PNP bipolar transistor associated with the p-type substrate, the n-type tub, and the p-type tub, and thus can increase substrate isolation and enhance IC latch-up immunity.

In certain implementations, the p-well corresponds to a high voltage p-well (HVPW), and the PNPN protection structure includes a shallow p-well (SHPW), a shallow n-well (SHNW), a first n-type active (N+) region, a second N+ region, and a first p-type active (P+) fabricated within the HVPW. The SHPW can be positioned adjacent the SHNW in the HVPW. Additionally, the second N+ region can be positioned in the SHPW and connected to the first pin, and the first N+ region and the first P+ region can be positioned adjacent one another in the SHNW and connected to the second pin. Furthermore, in certain configurations, the n-well corresponds to a high voltage n-well (HVNW) that is configured to laterally surround the HVPW, and the PN diode protection structure is provided using one or more SHNW/SHPW semiconductor junctions in the HVNW. The PNPN protection structure and the PN diode protection structure can be tuned by, for example, controlling spacing and geometry and/or including additional implants or structures, to provide forward and/or reverse trigger and holding voltages desirable for a particular application.

Figure 2A:
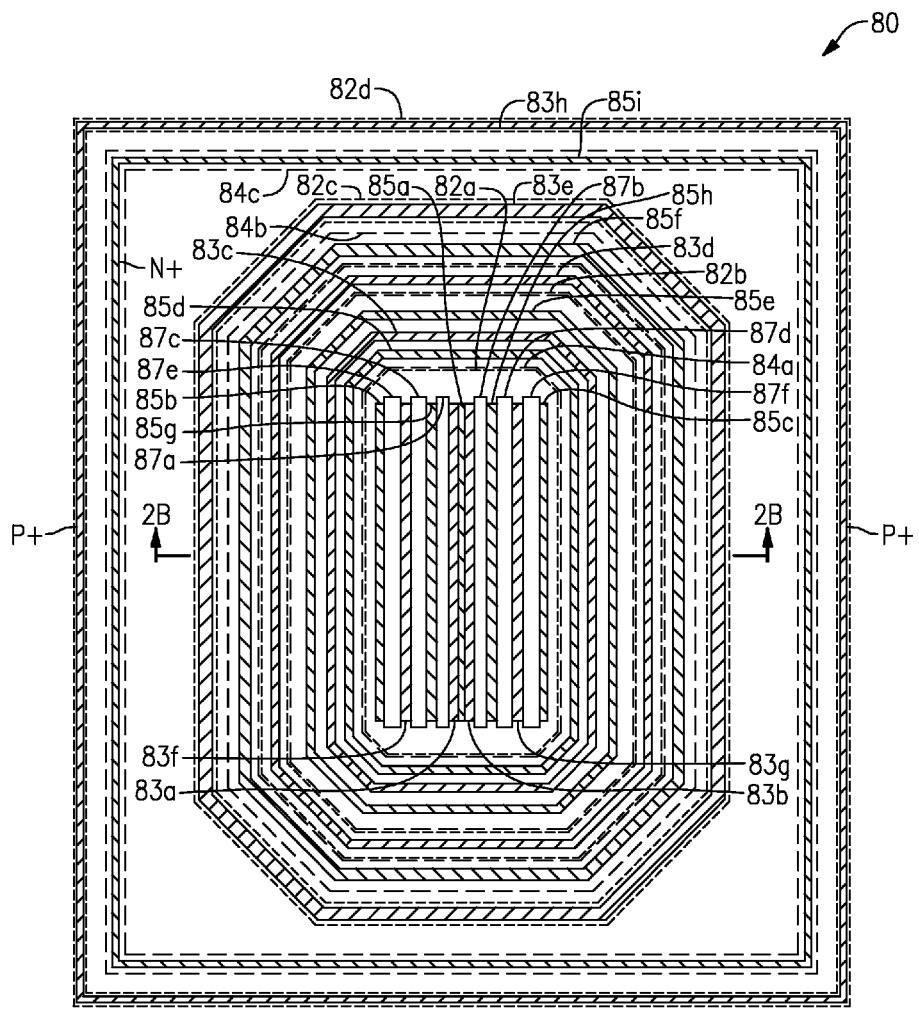
FIG. 2A is a top plan view of a dual-tub junction-isolated voltage clamp device according to one embodiment.
Figure 2B:
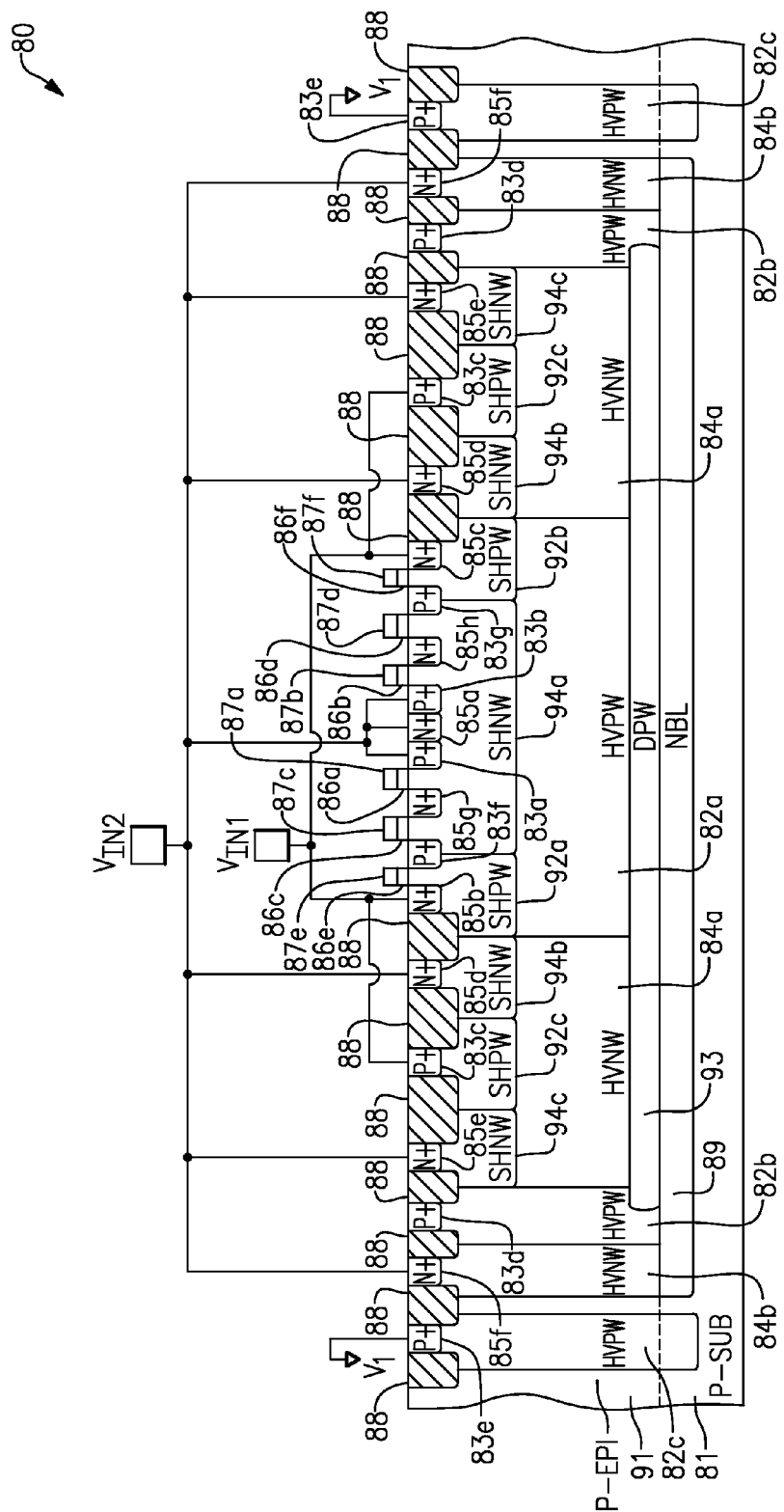
FIG. 2B is a cross section of the dual-tub junction-isolated voltage clamp device of FIG. 2A taken along the lines 2B-2B.
Figure 2C:
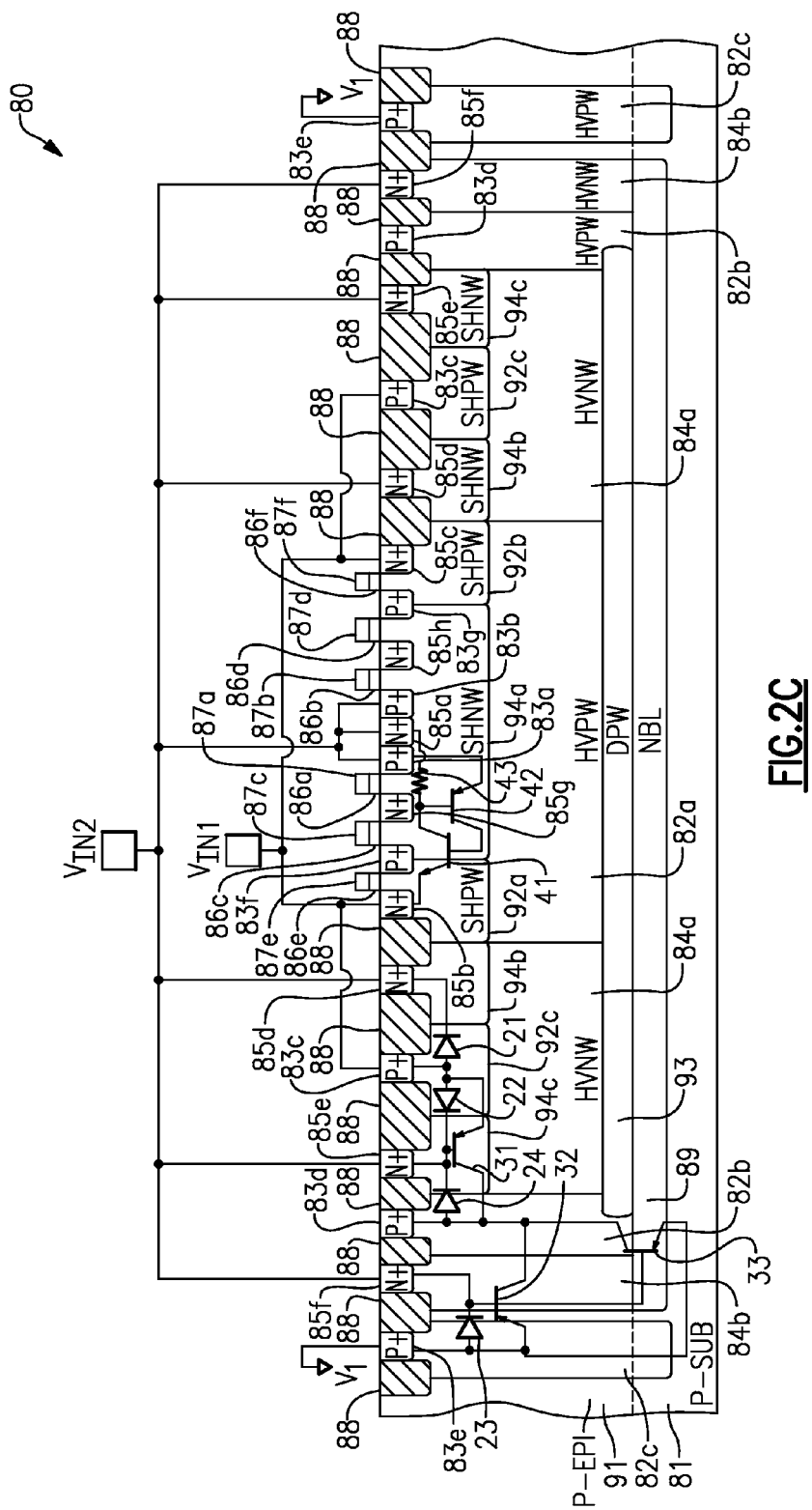
FIG. 2C is an annotated cross section of the dual-tub junction-isolated voltage clamp device of FIG. 2A taken along the lines 2B-2B.

FIG. 2A a top plan view of a dual-tub junction-isolated voltage clamp device 80 or protection device 80 according to one embodiment. FIG. 2B is a cross section of the dual-tub junction-isolated voltage clamp device 80 of FIG. 2A taken along the lines 2B-2B. FIG. 2C is an annotated cross section of the dual-tub junction-isolated voltage clamp device 80 of FIG. 2A taken along the lines 2B-2B.

The dual-tub junction-isolated voltage clamp device 80 includes a p-type substrate (P-SUB) 81, a p-type epitaxial layer (P-EPI) 91, a first high voltage p-well (HVPW) 82a, a second HVPW 82b, a third HVPW 82c, a fourth HVPW 82d, a first high voltage n-well (HVNW) 84a, a second HVNW 84b, a third HVNW 84c, a first shallow p-well (SHPW) 92a, a second SHPW 92b, a third SHPW 92c, a first shallow n-well (SHNW) 94a, a second SHNW 94b, a third SHNW 94c, first to eighth p-type active (P+) regions 83a-83h, first to ninth n-type active (N+) regions 85a-85i, an n-type buried layer (NBL) 89, a deep p-well layer (DPW) 93, first to sixth gate dielectric regions 86a-86f, first to sixth gate conductors 87a-87f, and oxide or non-conductive regions 88.

For purposes of clarity, the P-SUB 81, the first to sixth gate dielectric regions 86a-86f, the oxide regions 88, the n-type buried layer 89, the P-EPI 91, the first to third SHPWs 92a-92c, the deep p-well layer 93, and the first to third SHNWs 94a-94c, have been omitted from the top plan view of FIG. 2A.

In the illustrated configuration, the NBL 89 is disposed in the P-SUB 81, and the P-EPI 91 is disposed over the P-SUB 81. Additionally, the DPW 93 is positioned in the P-EPI 91 over the NBL 89. In certain implementations, the P-EPI 91 is a lightly doped region allowing the operation at relatively high voltage conditions, such as in mixed-signal high voltage BCD processes. Additionally, in the illustrated configuration the first to fourth HVPWs 82a-82d and the first to third HVNWs 84a-84c are in the P-EPI 91 and configured as annular rings. For example, the first HVNW 84a is configured to laterally surround the first HVPW 82a, the second HVPW 82b is configured to laterally surround the first HVNW 84a, the second HVNW 84b is configured to laterally surround the second HVPW 82b, the third HVPW 82c is configured to laterally surround the second HVNW 84b, the third HVNW 84c is configured to laterally surround the third HVPW 82c, and the fourth HVPW 82d is configured to laterally surround the third HVNW 84c.

The first SHNW 94a and the first and second SHPWs 92a, 92b are disposed in the first HVPW 82a with the first SHNW 94a positioned between the first and second SHPWs 92a, 92b. Additionally, the second SHNW 94b, the third SHPW 92c, and the third SHNW 94c have been configured as annular rings in the first HVNW 84a. For example, the third SHPW 92c can be configured to laterally surround the second SHNW 94b, and the third SHNW 94c can be configured to laterally surround the third SHPW 92c.

As shown in FIGS. 2A-2C, the first and second P+ regions 83a, 83b and the first N+ region 85a are disposed in the first SHNW 94a with the first N+ region 85a positioned between the first and second P+ regions 83a, 83b. Additionally, the seventh N+ region 85g is disposed in the first SHNW 94a on a side of the first P+ region 83a opposite the first N+ region 85a. Furthermore, the eighth N+ region 85h is disposed in the first SHNW 94a on a side of the second P+ region 83b opposite the first N+ region 85a. The second N+ region 85b is disposed in the first SHPW 92a, and the third N+ region 85c is disposed in the second SHPW 92b. The sixth P+ region 83f extends along an edge between the first SHPW 92a and the first SHNW 94a and includes a first portion in the first SHPW 92a and a second portion in the first SHNW 94a. The seventh P+ region 83g extends along an edge between the second SHPW 92b and the first SHNW 94a and includes a first portion in the second SHPW 92b and a second portion in the first SHNW 94a. The fourth N+ region 85d is disposed in the second SHNW 94b, the third P+ region 83c is disposed in the third SHPW 92c, and the fifth N+ region 85e is disposed in the third SHNW 94c. Additionally, the fourth P+ region 83d is disposed in the second HVPW 82b, the sixth N+ region 85f is disposed in the second HVNW 84b, the fifth P+ region 83e is disposed in the third HVPW 82c, the ninth N+ region 85i is disposed in the third HVNW 84c, and the eighth P+ region 83h is disposed in the fourth HVPW 82d.

The dual-tub junction-isolated voltage clamp device 80 includes the first to sixth gate dielectric regions 86a-86f and first to sixth gate conductors 87a-87f, which collective operate as gate structures that can provide implant blocking to define the position of certain diffusion or active regions. The first gate dielectric region 86a and the first gate conductor 87a extend over a portion of the first SHNW 94a between the first P+ region 83a and the seventh N+ region 85g. Additionally, the second gate dielectric region 86b and the second gate conductor 87b extend over a portion of the first SHNW 94a between the second P+ region 83b and the eighth N+ region 85h. Furthermore, the third gate dielectric region 86c and the third gate conductor 87c extend over a portion of the first SHNW 94a between the sixth P+ region 83f and the seventh N+ region 85g. Additionally, the fourth gate dielectric region 86d and the fourth gate conductor 87d extend over a portion of the first SHNW 94a between the seventh P+ region 83g and the eighth N+ region 85h. Furthermore, the fifth gate dielectric region 86e and the fifth gate conductor 87e extend over a portion of the first SHPW 92a between the sixth P+ region 83f and the second N+ region 85b. Additionally, the sixth gate dielectric region 86f and the sixth gate conductor 87f extend over a portion of the second SHPW 92b between the seventh P+ region 83g and the third N+ region 85c. In certain implementations, the first to sixth gate conductors 87a-87f include metal and/or polysilicon and the first to sixth gate dielectric regions 86a-86f include a dielectric such as a high-k dielectric. However, other configurations are possible.

The illustrated dual-tub junction-isolated voltage clamp device 80 includes the oxide regions 88. Formation of the isolation regions can involve etching trenches in the P-EPI 91, filling the trenches with a dielectric, such as silicon dioxide ($SiO_2$), and removing the excess dielectric using any suitable method, such as chemical-mechanical planarization. In certain implementations, the oxide regions 88 can be shallow trench regions disposed between certain active regions.

The dual-tub junction-isolated voltage clamp device 80 can be fabricated using any suitable manufacturing process. In one embodiment, the P-SUB 81 can be implanted with the NBL 89, and the P-EPI 91 can be grown over the P-SUB 81 and NBL 89 using an epitaxial growth process. Thereafter, the DPW 93 can be implanted in the P-EPI 91, and the first to fourth HVPWs 82a-82d and the first to third HVNWs 84a-84c can be implanted in the P-EPI 91. Next, the first to third SHPWs 92a-92c and first to third SHNWs 94a-94c can be implanted, and the oxide regions 88 can be formed in the P-EPI 91. Thereafter the first to sixth gate dielectric regions 86a-86f and the first to sixth gate conductors 87a-87f can be formed over the P-EPI 91, followed by implantation of the first to ninth N+ regions 85a-85i and the first to eighth P+ regions 83a-83h. Although one possible manufacturing process of the dual-tub junction-isolated voltage clamp device 80 has been described, variations and other implementations are possible as will be recognized by persons of ordinary skill in the art.

In one embodiment, the first to eighth P+ regions 83a-83h and the first to ninth N+ regions 85a-85i have a depth into the P-EPI 91 in the range of about 0.15 µm and about 0.5 µm, for example, about 0.2 µm, the first to third SHPWs 92a-92c and the first to third SHNWs 94a-94c have a depth into the P-EPI 91 in the range of about 0.5 µm and about 1.5 µm, for example, about 1.0 µm, and the first to fourth HVPWs 82a-82d and the first to third HVNWs 84a-84c have a depth into the P-EPI 91 in the range of about 3.0 µm and about 4.5 µm, for example, about 3.5 µm. Additionally, the P-EPI 91 can have a thickness in the range of about 4 µm and about 6 µm, for example, about 4.5 µm, and a peak doping of the NBL 89 can have a depth into the P-SUB 81 in the range of about 4.0 µm and about 5.5 µm, for example, about 5.0 µm. As shown in FIGS. 2B-2C, the first to fourth HVPWs 82a-82d can have a depth sufficient to reach the DPW 93, and the first to third HVNWs 84a-84c can have a depth sufficient to reach the NBL 89. The depth of peak doping of the DPW can be in the range of 1.5 µm to 3 µm, for example, 2.0 µm. In certain implementations, the oxide regions 88 can be relatively deeper than the first to eighth P+ regions 83a-83h and the first to ninth N+ regions 85a-85i. Although various examples of depths have been described above, persons having ordinary skill in the art will readily ascertain other suitable depth values.

In one embodiment, the P-SUB 81 has a peak doping concentration in the range of about $0.5 \times 10^{15}$ atoms/cm$^{-3}$ or cm$^{-3}$ to about $1.5 \times 10^{15}$ cm$^{-3}$, for example, about $1.0 \times 10^{15}$ cm$^{-3}$, the P-EPI 91 has a peak doping concentration in the range of about $1 \times 10^{14}$ cm$^{-3}$ to about $8.0 \times 10^{14}$ cm$^{-3}$, for example, about $2.0 \times 10^{14}$ cm$^{-3}$. Additionally, the DPW 93 has a peak doping concentration in the range of about $8 \times 10^{16}$ cm$^{-3}$ to about $2 \times 10^{17}$ cm$^{-3}$, for example, about $1.0 \times 10^{17}$ cm$^{-3}$, and the NBL 89 has a peak doping concentration in the range of about $0.5 \times 10^{17}$ cm$^{-3}$ to about $4 \times 10^{17}$ cm$^{-3}$, for example, about $2.5 \times 10^{17}$ cm$^{-3}$. Furthermore, the first to eighth P+ regions 83a-83h and the first to ninth N+ regions 85a-85i have a peak doping concentration in the range of about $1 \times 10^{20}$ cm$^{-3}$ to about $8 \times 10^{20}$ cm$^{-3}$, for example, about $5 \times 10^{20}$ cm$^{-3}$, the SHPWs 92a-92c and the SHNWs 94a-94c have a peak doping concentration in the range of about $2.5 \times 10^{17}$ cm$^{-3}$ to about $9.5 \times 10^{17}$ cm$^{-3}$, for example, about $7.0 \times 10^{17}$ cm$^{-3}$, and the HVPWs 82a-82d and HVNWs 84a-84c have a peak doping concentration in the range of about $1.5 \times 10^{16}$ cm$^{-3}$ to about $7.5 \times 10^{16}$ cm$^{-3}$, for example, about $3.0 \times 10^{16}$ cm$^{-3}$. Although various ranges of peak doping concentrations and depth have been described above, persons having ordinary skill in the art will readily ascertain other suitable doping concentrations]

As described above, the HVPWs 82a-82c can have a peak doping concentration that is less than a peak doping concentration of the SHPW 92, but a depth of the HVPWs 82a-82d can be greater than a depth of the SHPWs 92a-92c. Similarly, the HVNWs 84a-84c can have a peak doping concentration that is less than a peak doping concentration of the SHNWs 94a-94c, but a depth of the HVNWs 84a-84c can be greater than a depth of the SHNWs 94a-94c.

As shown in FIGS. 2B-2C, various electrical connections between active regions and a first pin or terminal $V_{IN1}$, a second pin or terminal $V_{IN2}$, and a first reference voltage $V_1$ have been depicted in schematic form. Persons having ordinary skill in the art will appreciate that the dual-tub junction-isolated voltage clamp device 80 can undergo processing to form contacts and metallization that can be used to provide the illustrated connections.

In the illustrated configuration, the first pin $V_{IN1}$ is electrically connected to the third P+ region 83c and to the second and third N+ regions 85b, 85c. Additionally, the second pin $V_{IN2}$ is electrically connected to the first and second P+ regions 83a, 83b, to the first N+ region 85a, and to the fourth to sixth N+ regions 85d-85f. Furthermore, the first reference voltage $V_1$ is electrically connected to the fifth P+ active region 83e. In the illustrated configuration, the sixth P+ region 83f, the seventh P+ region 83g, the seventh N+ region 85g, the eighth N+ region 85h, and the first to sixth gate conductors 87a-87f are electrically floating or unconnected to a controlled electrical potential via metallization.

Although not illustrated in the cross-sections of FIGS. 2B-2C, in certain implementations the ninth N+ region 85i of FIG. 2A can be electrically connected to a high voltage power high supply, and the eighth P+ region 83h of FIG. 2A can be electrically connected to a high voltage power low supply. In certain implementations, a voltage difference between the high voltage power high supply and the high voltage power low supply can be 60 V or more. The third HVNW 84c/ninth N+ region 85i and the fourth HVPW 82d/eighth P+ region 83h can operate as guard rings of the dual-tub junction-isolated voltage clamp device 80. Thus, electrically connecting the ninth N+ region 85i and the eighth P+ region 83h to high voltage power high and power low supplies, respectively, can provide enhanced isolation between the dual-tub junction-isolated voltage clamp device 80 and other circuitry fabricated in the P-SUB 81 and/or P-EPI 91.

The dual-tub junction-isolated voltage clamp device 80 of FIG. 2C has been annotated to show equivalent circuit devices of the illustrated structure, such as a first diode 21, a second diode 22, a third diode 23, a fourth diode 24, a first PNP parasitic bipolar transistor 31, a second PNP parasitic bipolar transistor 32, a third PNP parasitic bipolar transistor 33, an NPN thyristor bipolar transistor 41, a PNP thyristor bipolar transistor 42, and a thyristor resistor 43. Although various circuit devices have been illustrated for the left-hand side of the dual-tub junction-isolated voltage clamp device 80, the dual-tub junction-isolated voltage clamp device 80 can include corresponding circuit structures associated with the right-hand side of the device.

As shown in FIG. 2C, the first diode 21 includes an anode associated with the third SHPW 92c and a cathode associated with the second SHNW 94b. Additionally, the second diode 22 includes an anode associated with the third SHPW 92c and a cathode associated with the third SHNW 94c. Furthermore, the third diode 23 includes an anode associated with the third HVPW 82c/P-EPI 91 and a cathode associated with the second HVNW 84b. Additionally, the fourth diode 24 includes an anode associated with the second HVPW 82b and a cathode associated with the third SHNW 94c. Furthermore, the first PNP parasitic bipolar transistor 31 includes an emitter associated with the third SHPW 92c, a base associated with the third SHNW 94c, and a collector associated with the second HVPW 82b. Additionally, the second PNP parasitic bipolar transistor 32 includes an emitter associated with the third HVPW 82c/P-EPI 91, a base associated with the second HVNW 84b, and a collector associated with the second HVPW 82b. Furthermore, the third PNP parasitic bipolar transistor 33 includes an emitter associated with the P-SUB 81, a base associated with the NBL 89, and a collector associated with the second HVPW 82b/DPW 93. Additionally, the NPN thyristor bipolar transistor 41 includes an emitter associated with the second N+ region 85b, a base associated with the first SHPW 92a, and a collector associated with the first SHNW 94a. Furthermore, the PNP thyristor bipolar transistor 42 includes an emitter associated with the first P+ region 83a, a base associated with the first SHNW 94a, and a collector associated with the first SHPW 92a. The thyristor resistor 43 is associated with the resistance of the first SHNW 94a/first N+ region 85a between the base and emitter of the PNP thyristor bipolar transistor 42.

In the illustrated configuration, the second HVPW 82b and the DPW 93 operate as a p-type isolation region or tub that surrounds the bottom and sides of the first HVNW 84a and the first HVPW 82a and the structures and devices therein. In particular, the DPW 93 extends beneath the first HVNW 84a and the first HVPW 82a, while the first HVNW 84a contact the DPW 93 and surround the sides of the first HVNW 84a and the first HVPW 82a. Additionally, the second HVNW 84b and the NBL 89 operate as an n-type isolation region or tub that surrounds the p-type tub. In particular, the NBL 89 extends beneath the DPW 93 and the second HVPW 82b, while the second HVNW 84b contacts the NBL 89 and surround the sides of the second HVPW 82b.

The dual-tub isolation structure can electrically isolate the voltage clamp device 80 from other devices or structures fabricated in the P-SUB 81 and/or P-EPI 91. Additionally, as shown in FIGS. 2B-2C, the p-type tub can be electrically floating, and thus can be used to prevent the first to third PNP parasitic bipolar transistors 31-33 from activating, since the collectors of these transistors are electrically connected to the p-type tub.

Figure 3:
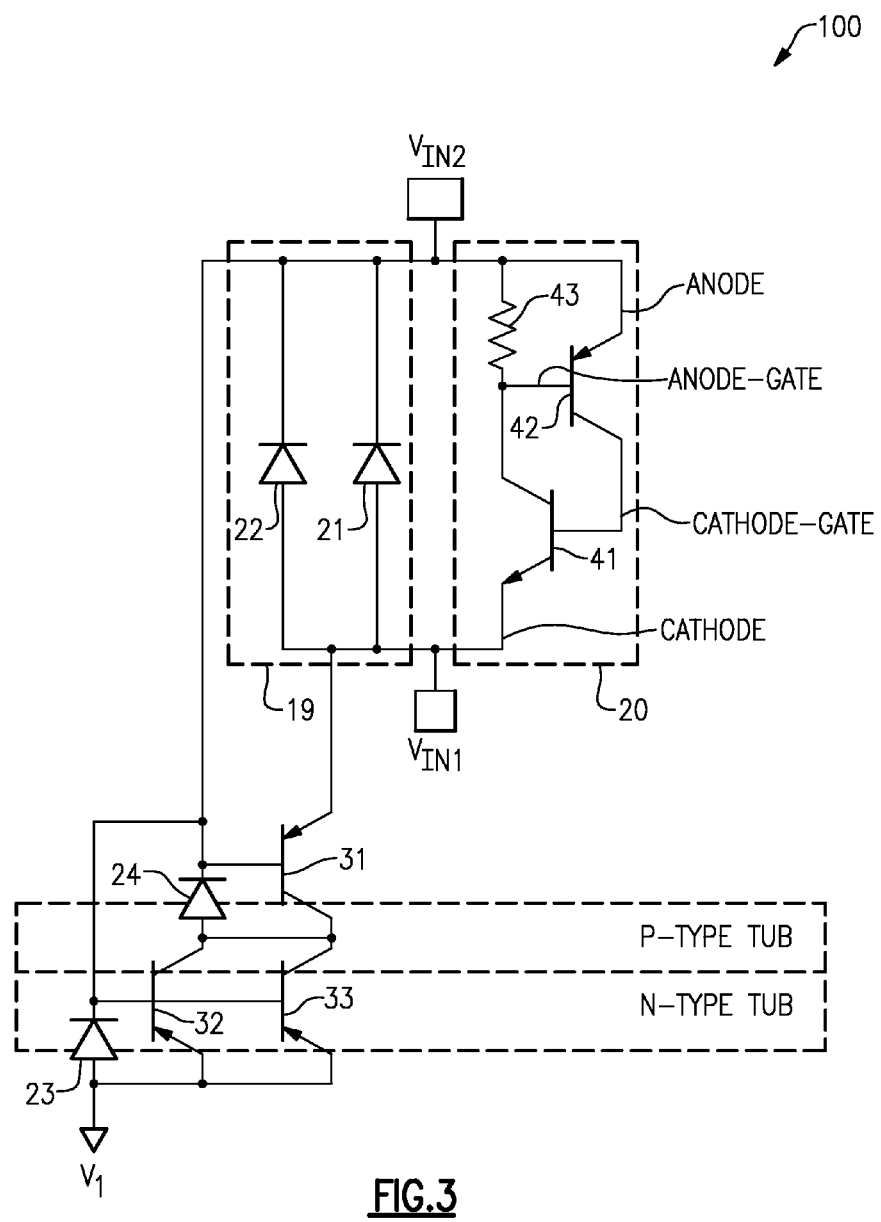
FIG. 3 is a circuit diagram of the dual-tub junction-isolated voltage clamp device of FIGS. 2A-2C.

FIG. 3 is a circuit diagram 100 of the dual-tub junction-isolated voltage clamp device 80 of FIGS. 2A-2C. The circuit diagram 100 includes the first and second pins $V_{IN1}$, $V_{IN2}$, the first to fourth diodes 21-24, the first to third PNP parasitic bipolar transistors 31-33, the NPN thyristor bipolar transistor 41, the PNP thyristor bipolar transistor 42, and the thyristor resistor 43, which can be as described earlier.

In the illustrated configuration, the first and second diodes 21, 22 operate as a PN diode protection structure 19, and the NPN thyristor bipolar transistor 41, the PNP thyristor bipolar transistor 42, and the thyristor resistor 43 operate as an SCR or thyristor or PNPN protection structure 20. The PN diode protection structure 19 and the PNPN protection structure 20 are electrically connected in parallel between the first and second pins $V_{IN1}$, $V_{IN2}$. As shown in FIG. 3, the PN diode protection structure 19 includes an anode electrically connected to the first pin $V_{IN1}$ and a cathode electrically connected to the second pin $V_{IN2}$, and the PNPN protection structure 20 includes a cathode electrically connected to the first pin $V_{IN1}$ and an anode electrically connected to the second pin $V_{IN2}$. The PNPN protection structure 20 further includes an anode-gate electrically connected to the second pin $V_{IN2}$ through the thyristor resistor 43, and a cathode-gate. In the illustrated configuration, no resistor is provided between the cathode-gate and the cathode such that the NPN thyristor bipolar transistor 41 operates with a breakdown voltage collector-emitter base open (BVCEO) characteristic.

Although the circuit diagram 100 illustrates a particular configuration of circuit components, persons having ordinary skill in the art will appreciate that the teachings herein are applicable to other configurations of protection structures and circuits. For instance, the PNPN protection structure 20 can be replaced with a different clamp voltage structure formation between the first and second pins $V_{IN1}$, $V_{IN2}$ to achieve desired operating and/or clamp voltage targets, such as those described further below with reference to FIGS. 5A-7E.

The first diode 21 includes an anode electrically connected to the first pin $V_{IN1}$ and a cathode electrically connected to the second pin $V_{IN2}$. The second diode 22 includes an anode electrically connected to the first pin $V_{IN1}$ and a cathode electrically connected to the second pin $V_{IN2}$. The third diode 23 includes an anode electrically connected to the first reference voltage $V_1$ and a cathode electrically connected to the second pin $V_{IN2}$. The fourth diode 24 includes a cathode electrically connected to the second pin $V_{IN2}$ and an anode electrically connected to a collector of the first PNP parasitic bipolar transistor 31, to a collector of the second PNP parasitic bipolar transistor 32, and to a collector of the third PNP parasitic bipolar transistor 33. The first PNP parasitic bipolar transistor 31 further includes an emitter electrically connected to the first pin $V_{IN1}$ and a base electrically connected to the second pin $V_{IN2}$. The second PNP parasitic bipolar transistor 32 further includes an emitter electrically connected to the first reference voltage $V_1$ and a base electrically connected to the second pin $V_{IN2}$. The third PNP parasitic bipolar transistor 33 further includes an emitter electrically connected to the first reference voltage $V_1$ and a base electrically connected to the second pin $V_{IN2}$.

The PN diode protection structure 19 can be used to provide protection against a transient electrical event that increases the voltage of the first pin $V_{IN1}$ relative to the voltage of the second pin $V_{IN2}$. For example, the first and second diodes 21, 22 can activate and provide a low impedance path when the voltage difference between the first pin $V_{IN1}$ and the second pin $V_{IN2}$ is about equal to an activation voltage of the first and second diodes 21, 22. Although one example of a PN diode protection structure has been illustrated, other configurations are possible, including, for example, configurations in which the first diode 21 and/or the second diode 22 is omitted. For example, in certain configurations, a voltage clamp such as the PNPN protection structure 20 can directly provide a reverse conduction path from $V_{IN1}$ to $V_{IN2}$.

The PNPN protection structure 20 can be used to provide protection against a transient electrical event that increases the voltage of the second pin $V_{IN2}$ relative to the voltage of the first pin $V_{IN1}$. For example, the NPN thyristor bipolar transistor 41 and the PNP thyristor bipolar transistor 42 are cross-coupled in feedback such that an increase in the collector current of the NPN thyristor bipolar transistor 41 increases the base current of the PNP thyristor bipolar transistor 42 and an increase in the collector current of the PNP thyristor bipolar transistor 42 increases the base current of the NPN thyristor bipolar transistor 41. As the voltage of the second pin $V_{IN2}$ increases relative to the voltage of the first pin $V_{IN1}$ and reaches a forward trigger voltage of the PNPN protection structure 20, the feedback between the NPN thyristor bipolar transistor 41 and the PNP thyristor bipolar transistor 42 can be regenerative and cause the PNPN protection structure 20 to enter a low-impedance state. Thereafter, the feedback between the transistors can maintain the PNPN protection structure 20 in the low-impedance state as long as the voltage difference between the second pin $V_{IN2}$ and the first pin $V_{IN1}$ exceeds a forward holding voltage of the PNPN protection structure 20.

With reference to FIGS. 2A-3, the protection characteristics of the dual-tub junction-isolated voltage clamp device 80 can be tuned by controlling the characteristics of structures corresponding to the PN diode protection structure 19 and/or the PNPN protection structure 20. Thus, the voltage clamp device can be configured to have a protection characteristic suitable for a particular application or operating conditions, such as those associated with operating current or voltage levels and/or a particular external noise disturbance environment.

For example, in the configuration illustrated in FIGS. 2A-2C, the voltage clamp device's reverse protection characteristic is based on an activation voltage of diode structures associated with SHPW/SHNW semiconductor junctions, such as a junction between the third SHPW 92c and the second SHNW 94b and a junction between the third SHPW 92c and the third SHNW 94c. The size, shaping, or other structural features of these regions can be controlled to provide a reverse protection characteristic that is desired for a particular application. Furthermore, other configurations of PN diode protection structures are possible.

Additionally, in the configuration illustrated in FIGS. 2A-2C, the voltage clamp device's forward protection characteristic is based on the forward trigger and holding voltages of the SCR or PNPN protection structure associated with the P+ regions 83a/83b, the SHNW 94a, the SHPWs 92a/92b, and the N+ regions 85a-85c. The size, shaping, or other structural features of these regions can be controlled to help achieve a forward protection characteristic that is desired for a particular application. However, other configurations of PN diode protection structures are possible and/or additional structures can be provided to further control the protection characteristic. For example, as shown in FIGS. 2B-2C, the sixth and seventh P+ regions 83f, 83g and the seventh and eighth N+ regions 85g, 85h have been included in the voltage clamp device 80. The sixth and seventh P+ regions 83f, 83g increase the concentration of holes in the first and second SHPWs 92a, 92b, thereby lowering the device's blocking voltage and trigger voltage from the second pin $V_{IN2}$ to the first pin $V_{IN1}$. The seventh and eighth N+ regions 85g, 85h increase the concentration of electrons in the first SHNW 94a and can eliminate a parasitic PMOS leakage path formation between the sixth and seventh P+ regions 83f, 83g and the first and second P+ regions 83a, 83b. Configuring the voltage clamp device 80 in this manner can provide lower breakdown defined by the higher doping concentration of P+ regions 83f, 83g and provide lower leakage as compared with a configuration in which the seventh and eighth N+ regions 85g, 85h are omitted. Although FIGS. 2A-2C illustrates one configuration of a PNPN protection structure, other configurations can be used.

As shown in FIGS. 2A-3, the voltage clamp device 80 includes a dual-tub isolation structure that prevents the voltage clamp device 80 from interacting with external components and circuitry fabricated in a common substrate with the voltage clamp device 80, thereby providing superior latch-up immunity. For example, the collectors of the first to third PNP parasitic bipolar transistors 31-33 are electrically connected to the p-type tub, which has been configured to be electrically floating. Thus, the dual-tub isolation prevents activation of parasitic PNP bipolar structures and reduces the amount of charge the voltage clamp device 80 injects into the substrate during a transient electrical event received between the first and second pins $V_{IN1}$, $V_{IN2}$.

The PNPN protection structure 20 and PN diode protection structure 19 provide forward and reverse voltage clamping, respectively, between the first and second pins $V_{IN1}$, $V_{IN2}$. In certain implementations, the PNPN protection structure 20 provides a first blocking voltage between the first and second pins $V_{IN1}$, $V_{IN2}$, and the first blocking voltage is selected to be less than a junction isolation breakdown of the dual-tub isolation structure. Additionally, the first and second pins $V_{IN1}$, $V_{IN2}$ operate with voltages below the junction isolation breakdown voltage. Configuring the device is this manner allows the dual-tub isolation structure to provide the device with junction-isolation from a common substrate. Additionally, in certain implementations, the second pin $V_{IN2}$ operates with a voltage greater than the first pin $V_{IN1}$ and a voltage difference between the first and second pins $V_{IN1}$, $V_{IN2}$ is less than the first blocking voltage.

Although the dual-tub junction-isolated voltage clamp device 80 illustrates one configuration of a voltage clamp device in accordance with the teachings herein, voltage clamp devices can be implemented in other ways. For example, the structures used to implement the PN diode protection structure 19 and/or the PNPN protection structure 20 can be implemented in other ways. Additionally, in certain implementations, the n-type tub and/or p-type tub can be implemented using other configurations. As used herein, and as will be understood by one of skill in the art, the term "n-type tub" refers to any suitable n-type tub, including, for example, those used in buried n-layer technologies or in deep n-well technologies. Likewise, the term "p-type tub" refers to any suitable p-type tub.

In the configuration described above, the dual-tub junction-isolated voltage clamp device 80 is fabricated in a P-EPI 91 layer formed over a P-SUB 81. However, the teachings herein are applicable to other substrate configurations and manufacturing processes.

Various configurations of dual-tub junction-isolated voltage clamp devices are described below with reference to FIGS. 4-7E. Although specific examples have been provided, the teachings herein are applicable to a wide variety of other implementations and configurations.

Figure 4:
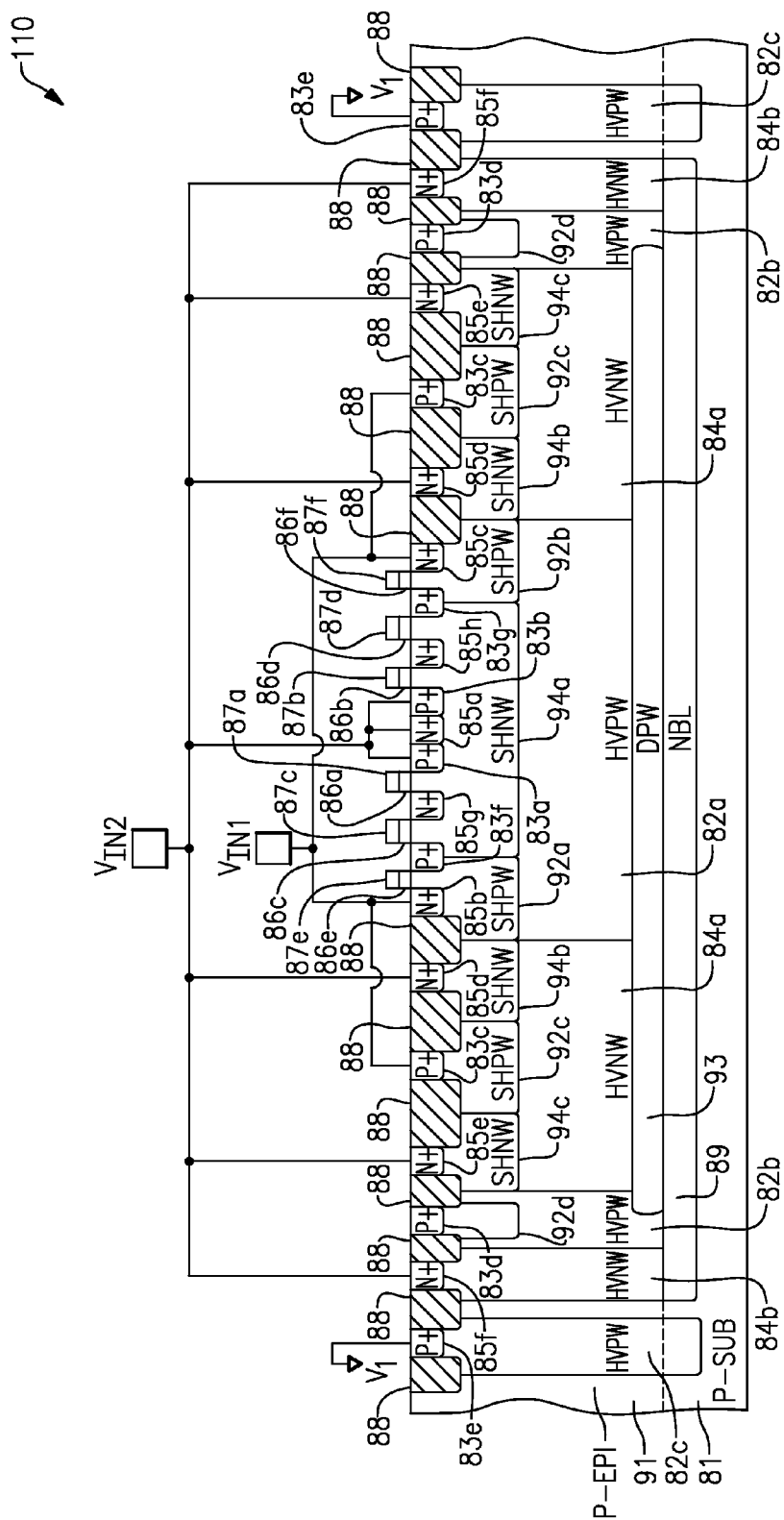
FIG. 4 is a cross section of another embodiment of a dual-tub junction-isolated voltage clamp device.

FIG. 4 is a cross section of another embodiment of a dual-tub junction-isolated voltage clamp device 110. The dual-tub junction-isolated voltage clamp device 110 of FIG. 4 is similar to the dual-tub isolated voltage clamp device 80 of FIGS. 2A-2C, except that the dual-tub junction-isolated voltage clamp device 110 further includes a fourth SHPW 92d disposed in the second HVPW 82b.

The fourth SHPW 92d can operate to reduce the gain of the first to third PNP parasitic bipolar transistors 31-33 shown in FIG. 4. Thus, the fourth SHPW 92d can be used to further reduce the likelihood of unintended activation of parasitic bipolar transistor structures.

However, the fourth SHPW 92d can also impact the reverse breakdown voltage of the device, such as the reverse breakdown of the fourth diode 24 shown in FIG. 2C. To help mitigate adverse impacts of including the fourth SHPW 92d, the voltage clamp device 110 of FIG. 4 has been implemented such that the edges of the fourth SHPW 92d are spaced both from a boundary between the second HVPW 82b and the first HVNW 84a and from a boundary between the second HVPW 82b and the second HVNW 84b. In certain implementations, the fourth SHPW 92d can be spaced from the second HVPW 82b/first HVNW 84a boundary and from the second HVPW 82b/second HVNW 84b boundary by a distance in the range of about 0.5 µm to about 3 µm, for example, about 1.5 µm. However, other distances are possible.

Figure 5A:
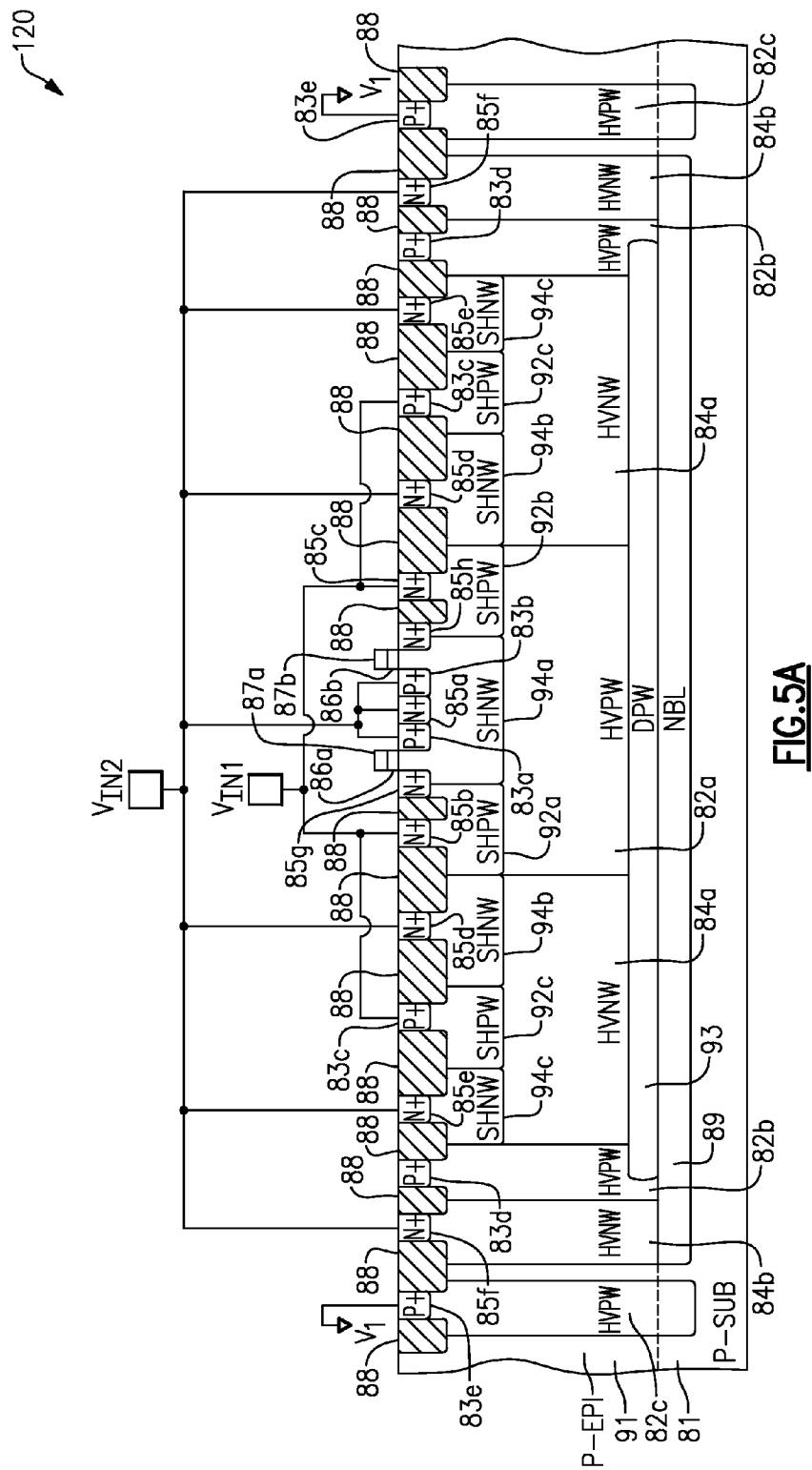
FIGS. 5A to 5D are cross sections of various embodiments of dual-tub junction-isolated voltage clamp devices.

FIG. 5A is a cross section of another embodiment of a dual-tub junction-isolated voltage clamp device 120. The dual-tub junction-isolated voltage clamp device 120 of FIG. 5A is similar to the dual-tub junction-isolated voltage clamp device 80 of FIGS. 2A-2C, except that the dual-tub junction-isolated voltage clamp device 120 illustrates a different configuration of a PNPN protection structure in which the sixth and seventh P+ regions 83f, 83g, the third to sixth gate dielectrics 86c-86f, and the third to sixth gate conductors 87c-87f have been omitted. Additionally, as shown in FIG. 5A, the voltage clamp device 120 illustrates a configuration in which the seventh N+ region 85g is disposed along a boundary between the first SHPW 92a and the first SHNW 94a and in which the eighth N+ region 85h is disposed along a boundary between the second SHPW 92b and the first SHNW 94a.

The voltage clamp device 120 of FIG. 5A lacks P+ active regions in the first and second SHPWs 92a, 92b, and thus can have a holding voltage that is lower than and a trigger voltage that is lower than that of the voltage clamp device 80 of FIGS. 2A-2C. For example, in one particular BCD process, the voltage clamp device 80 of FIGS. 2A-2C can provide a forward trigger voltage during a 2 ns rise time transmission line pulse (TLP) test in the range of about 10.8 V to about 13 V and a forward holding voltage in the range of about 2 V to about 2.1 V, while the voltage clamp device 120 of FIG. 5A can provide a forward trigger voltage in the range of about 8.5 V to about 9.8 V and a forward holding voltage in the range of about 1.5 V to about 1.8 V. Although various examples of trigger and holding voltages have been described, other configurations are possible.

Figure 5B:
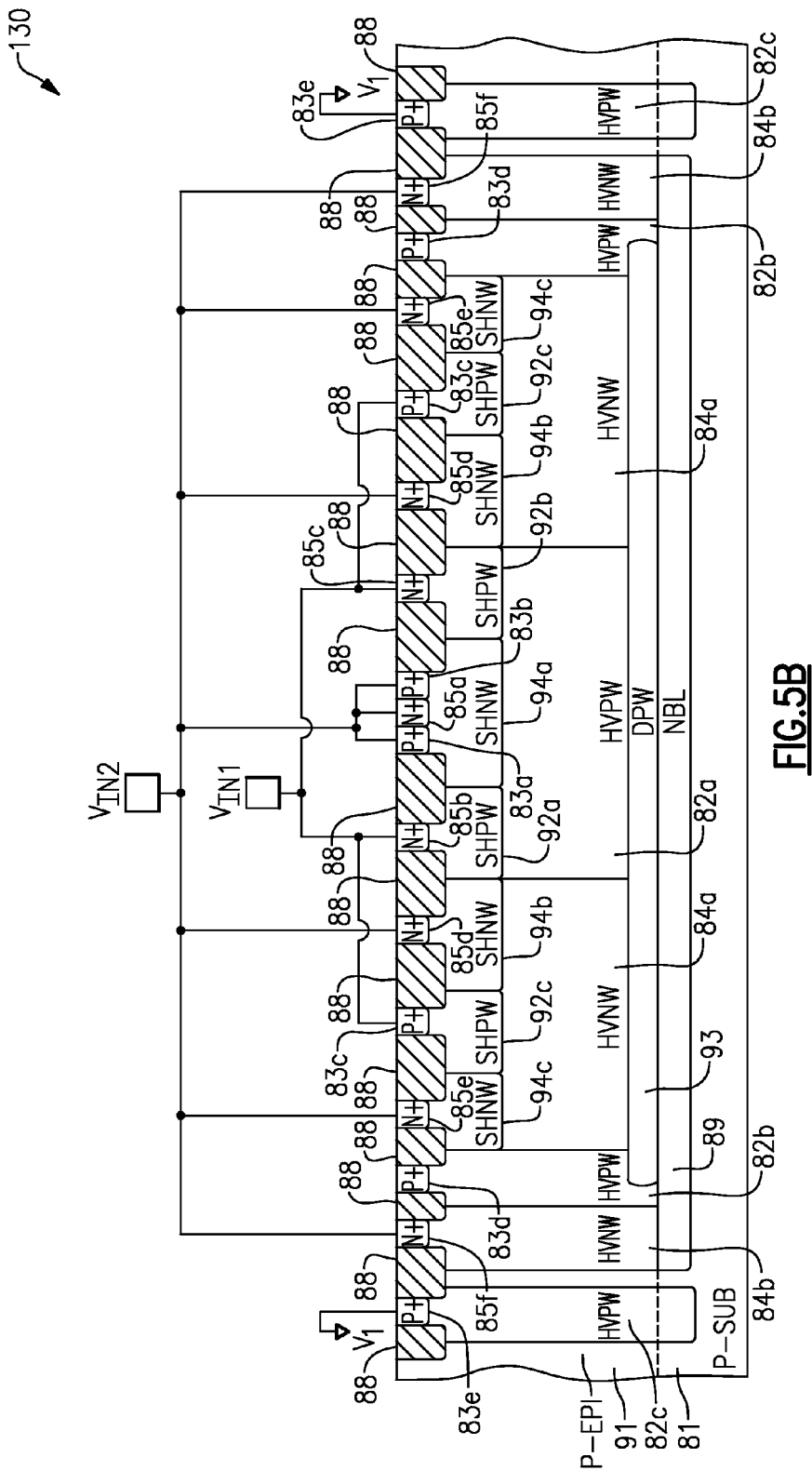

FIG. 5B is a cross section of another embodiment of a dual-tub junction-isolated voltage clamp device 130. The dual-tub junction-isolated voltage clamp device 130 of FIG. 5B is similar to the dual-tub junction-isolated voltage clamp device 80 of FIGS. 2A-2C, except that that the dual-tub junction-isolated voltage clamp device 130 illustrates a different configuration of a PNPN protection structure in which the sixth and seventh P+ regions 83f, 83g, the seventh and eighth N+ regions 85g, 85h, the first to sixth gate dielectrics 86c-86f, and the first to sixth gate conductors 87c-87f have been omitted.

By omitting the sixth and seventh P+ regions 83f, 83g and the seventh and eighth N+ regions 85g, 85h, the voltage clamp device 130 of FIG. 5B can have a lower concentration of holes in the first and second SHPWs 92a, 92b and a lower concentration of electrons in the first SHNW 94a relative to the voltage clamp device 80 of FIGS. 2A-2C. Thus, the voltage clamp device 130 of FIG. 5B can have a holding voltage that is higher than and a trigger voltage that is higher than that of the voltage clamp device 80 of FIGS. 2A-2C. For example, in one particular BCD process (180 nm 1.8/5/60V BCD), the voltage clamp device 130 of FIG. 5B can provide a forward trigger voltage in the range of about 15 V to about 18V and a forward holding voltage in the range of about 2.0 V to about 2.2 V. Although various examples of trigger and holding voltages have been described, other configurations are possible.

Figure 5C:
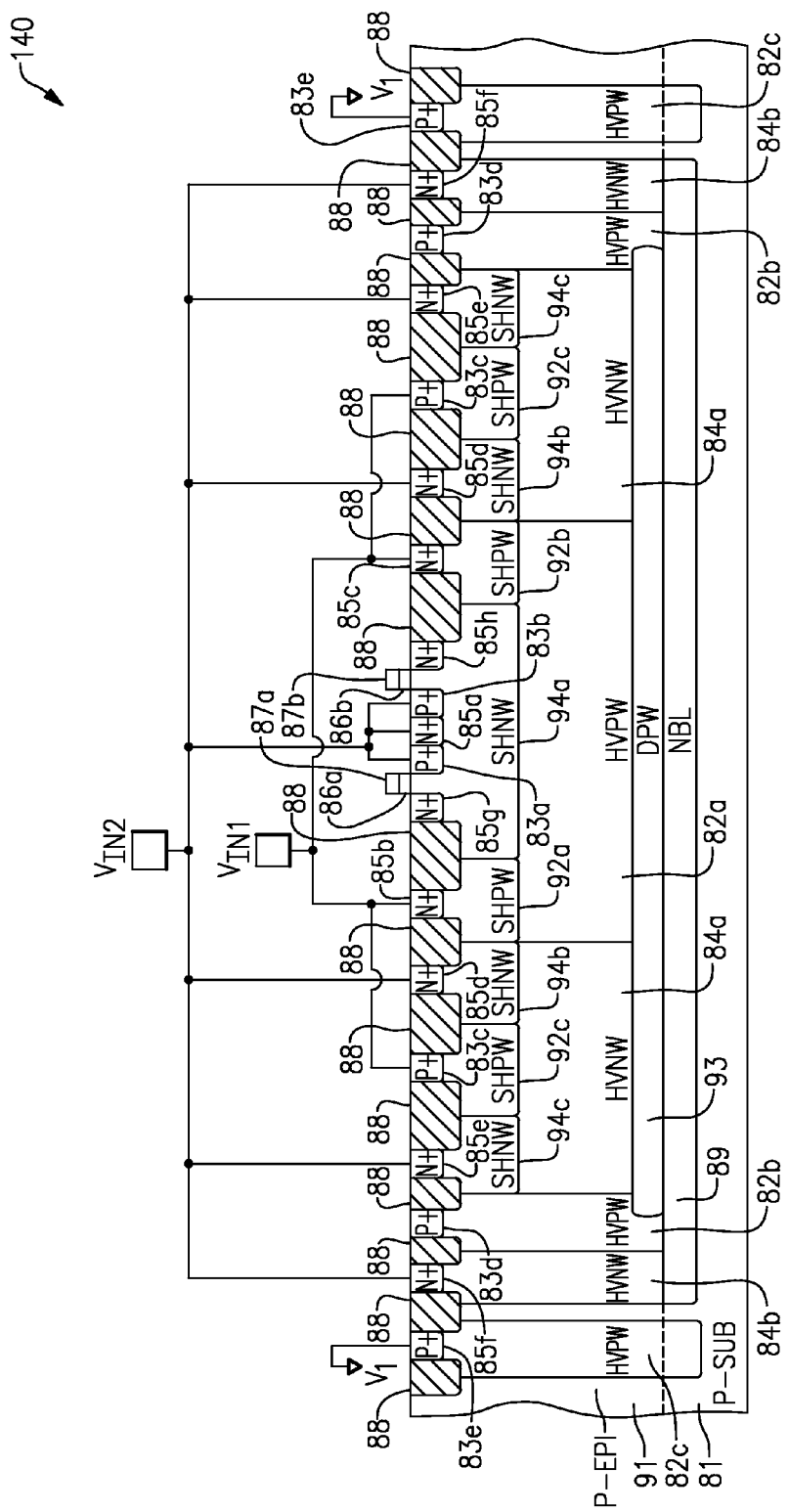

FIG. 5C is a cross section of another embodiment of a dual-tub junction-isolated voltage clamp device 140. The dual-tub junction-isolated voltage clamp device 140 of FIG. 5C is similar to the dual-tub junction-isolated voltage clamp device 80 of FIGS. 2A-2C, except that the dual-tub junction-isolated voltage clamp device 140 illustrates a different configuration of a PNPN protection structure in which the sixth and seventh P+ regions 83f, 83g, the third to sixth gate dielectrics 86c-86f, and the third to sixth gate conductors 87c-87f have been omitted in favor of providing oxide regions 88 between the second N+ region 85b and the seventh N+ region 85g and between the third N+ region 85c and the eighth N+ region 85h.

Configuring the voltage clamp device in this manner can result in the voltage clamp device 140 of FIG. 5C having a holding voltage that is higher than and a trigger voltage that is higher than that of the voltage clamp device 80 of FIGS. 2A-2C. For example, in one particular BCD process, the voltage clamp device 140 of FIG. 5C can provide a forward trigger voltage in the range of 15 V to about 18 V and a forward holding voltage in the range of about 2.5 V to about 4 V. Although various examples of trigger and holding voltages have been described, other configurations are possible.

Figure 5D:
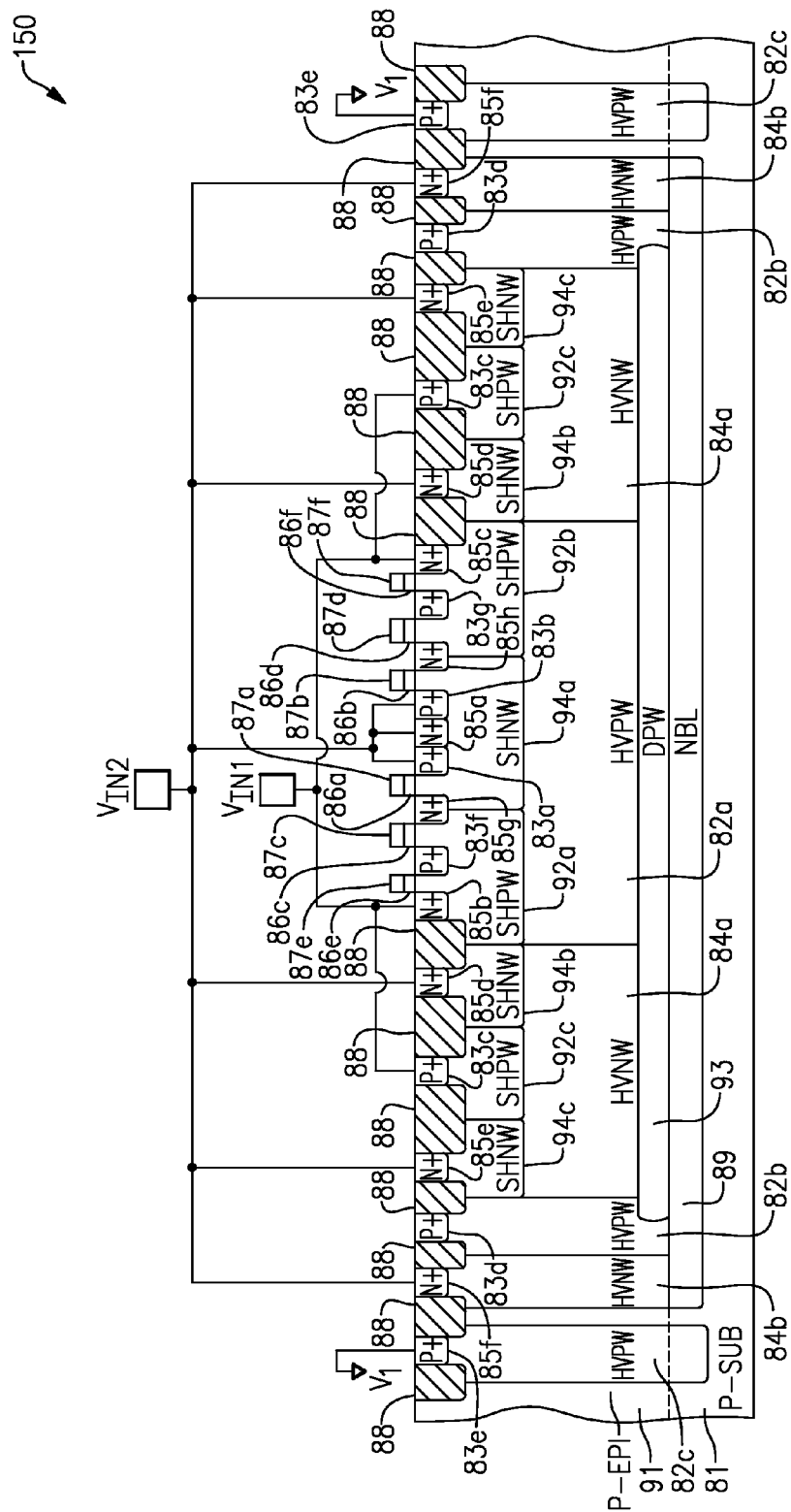

FIG. 5D is a cross section of another embodiment of a dual-tub junction-isolated voltage clamp device 150. The dual-tub junction-isolated voltage clamp device 150 of FIG. 5D is similar to the dual-tub junction-isolated voltage clamp device 80 of FIGS. 2A-2C, except that the dual-tub junction-isolated voltage clamp device 150 illustrates a different configuration of a PNPN protection structure in which a boundary between the first SHNW 94a and the first SHPW 92a is beneath the seventh N+ region 85g rather than beneath the sixth P+ region 83f, and in which a boundary between the first SHNW 94a and the second SHPW 92b is beneath the eighth N+ region 85h rather than beneath the seventh P+ region 83g.

Configuring the voltage clamp device in this manner can result in the voltage clamp device 150 of FIG. 5D having a holding voltage that is about the same level and a trigger voltage that is lower than that of the voltage clamp device 80 of FIGS. 2A-2C. For example, in one particular BCD process, the voltage clamp device 150 of FIG. 5D can provide a forward trigger voltage in the range of about 8.5 V to about 9.8V and a forward holding voltage in the range of about 2.0 V to about 2.1 V. Although various examples of trigger and holding voltages have been described, other configurations are possible.

Figure 6A:
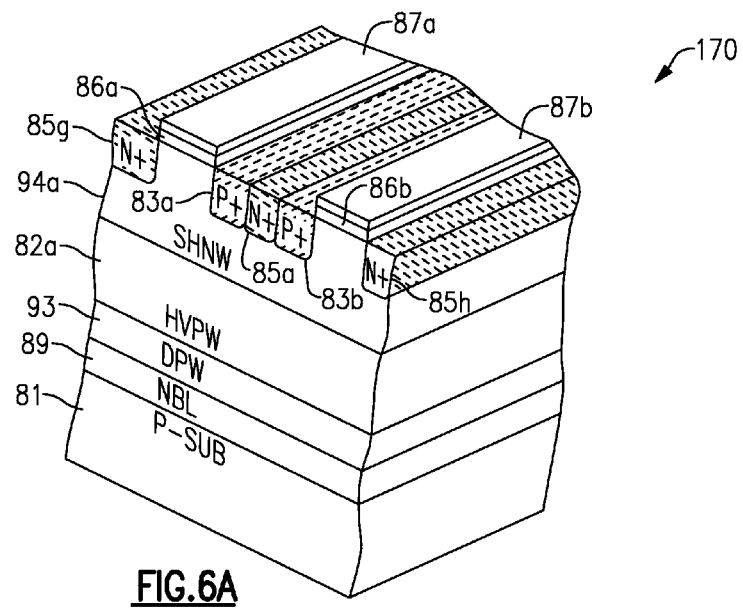
FIG. 6A is a schematic perspective view of a portion of a dual-tub junction-isolated voltage clamp device according to one embodiment.
Figure 6B:
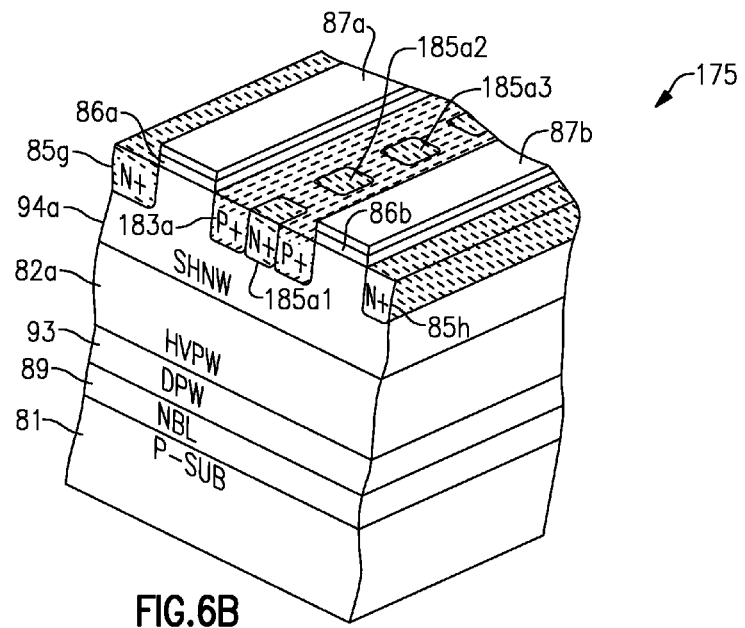
FIG. 6B is a schematic perspective view of a portion of a dual-tub junction-isolated voltage clamp device according to another embodiment.

FIG. 6A is a schematic perspective view 170 of a portion of a dual-tub junction-isolated voltage clamp device according to one embodiment. FIG. 6B is a schematic perspective view 175 of a portion of a dual-tub junction-isolated voltage clamp device according to another embodiment.

The configuration shown in FIG. 6A can correspond to a layout implementation of the first and second P+ regions 83a, 83b and the first N+ region 85a similar to that of the voltage clamp device 80 of FIGS. 2A-2C described earlier. For example, the first N+ region 85a has been positioned between the first and second P+ regions 83a, 83b, and the first N+ region 85a and the first and second P+ regions 83a, 83b have been configured to extend substantially along a first direction.

In contrast, the configuration shown in FIG. 6B includes a first P+ region 183a extending along the first direction, and a plurality of N+ island regions 185a1-185a3 disposed in the first P+ region 183a and extending along the first direction. Configuring the voltage clamp device in this manner can provide fine-tuned control of the device's PNPN protection structure. For example, increasing the area of the P+ regions relative to the area of the N+ regions as shown in FIG. 6B can operate to increase the strength of the PNP thyristor bipolar transistor 42 of FIG. 2C relative to that of the NPN thyristor bipolar transistor 41 of FIG. 2C.

As shown in FIGS. 6A-6B, the geometric structure of certain regions can provide another degree of control to obtain a desired protection characteristic. The configuration of the geometric structure can be selected along with a particular thyristor protection configuration to achieve an overall protection characteristic. Thus, the configurations shown in FIGS. 6A-6B as well as other arrangement can be used in the combination with any of the voltage clamp devices described herein.

FIGS. 7A to 7E are schematic diagrams including transmission line pulse (TLP) data and partial cross sectional views for various embodiments of dual-tub junction-isolated voltage clamp devices.

The TLP data corresponds to dual-tub junction-isolated voltage clamp devices developed in a 180 nm 1.8/5/60V BCD process. The measurements were taken at about room temperature, and each TLP measurement point can correspond to a voltage and a current measurement obtained by forcing a rectangular 100 ns current pulse having about a 2 ns rise time into the pad protection circuit and measuring the voltage of the pad protection circuit between about 40% and about 90% of the current pulse width. The DC leakage measurements were taken at after each TLP current pulse. As skilled artisans will appreciate, a relatively small variation in the leakage current value after each pulse can indicate the integrity of the IC. In contrast, drastic change in the leakage current can indicate IC damage.

Figure 7A:
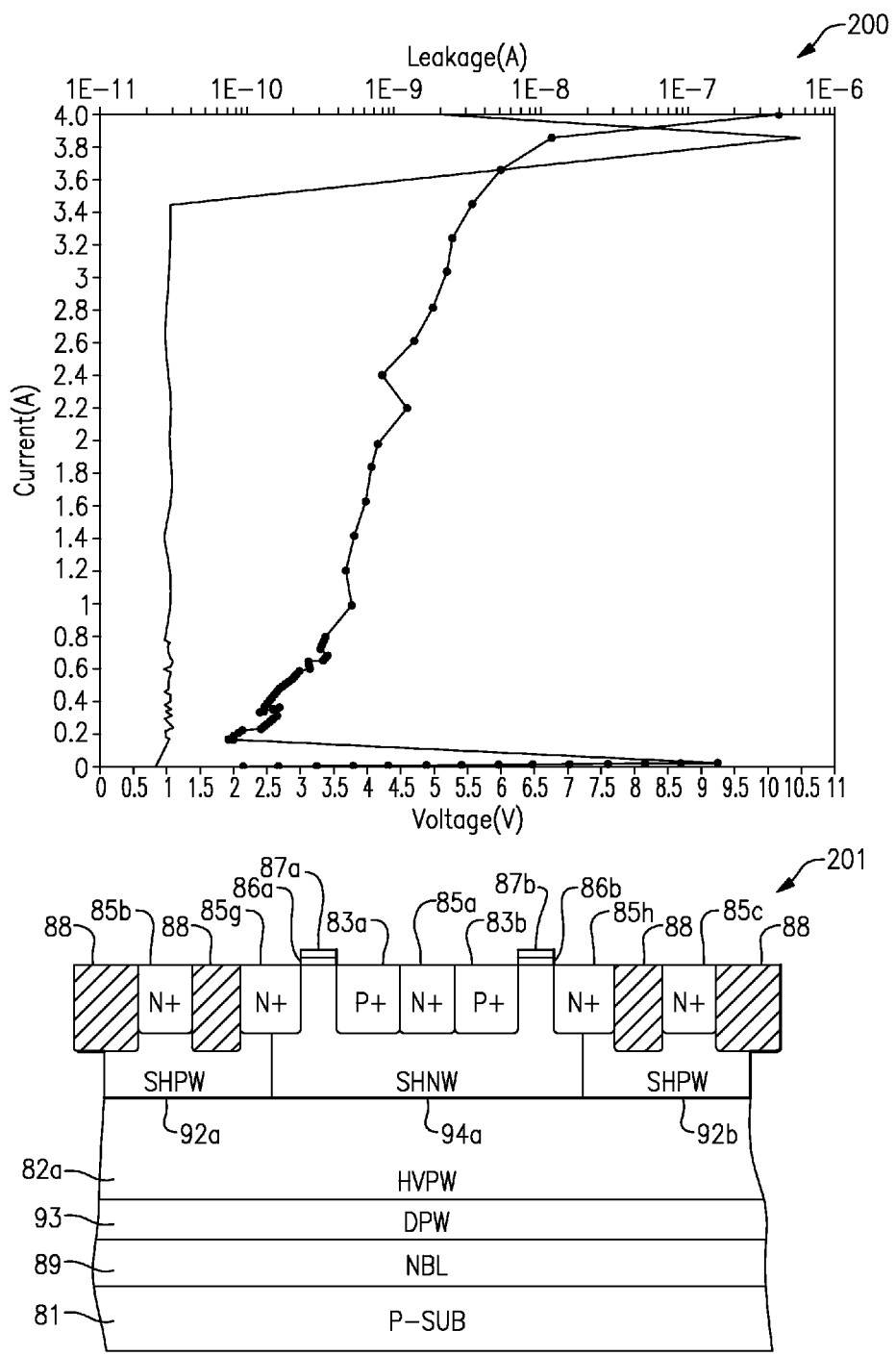
FIGS. 7A to 7E are schematic diagrams including transmission line pulse (TLP) data and partial cross sectional views for various embodiments of dual-tub junction-isolated voltage clamp devices.

FIG. 7A includes TLP data 200 and a partial cross-section 201 of a dual-tub junction-isolated voltage clamp device similar to that of the voltage clamp device 120 of FIG. 5A. The partial cross-section 201 corresponds to structures of the voltage clamp device related to the device's PNPN protection structure. However, persons of ordinary skill in the art will appreciate that the voltage clamp device includes other structures, such as a PN diode protection structure.

As shown in the TLP data 200 of FIG. 7A, the voltage clamp device can have a holding voltage of about 2 V and a trigger voltage between about 9 V and 9.5 V. However, other values are possible, such as voltages that depend on geometric structural features and/or fabrication processes.

Figure 7B:
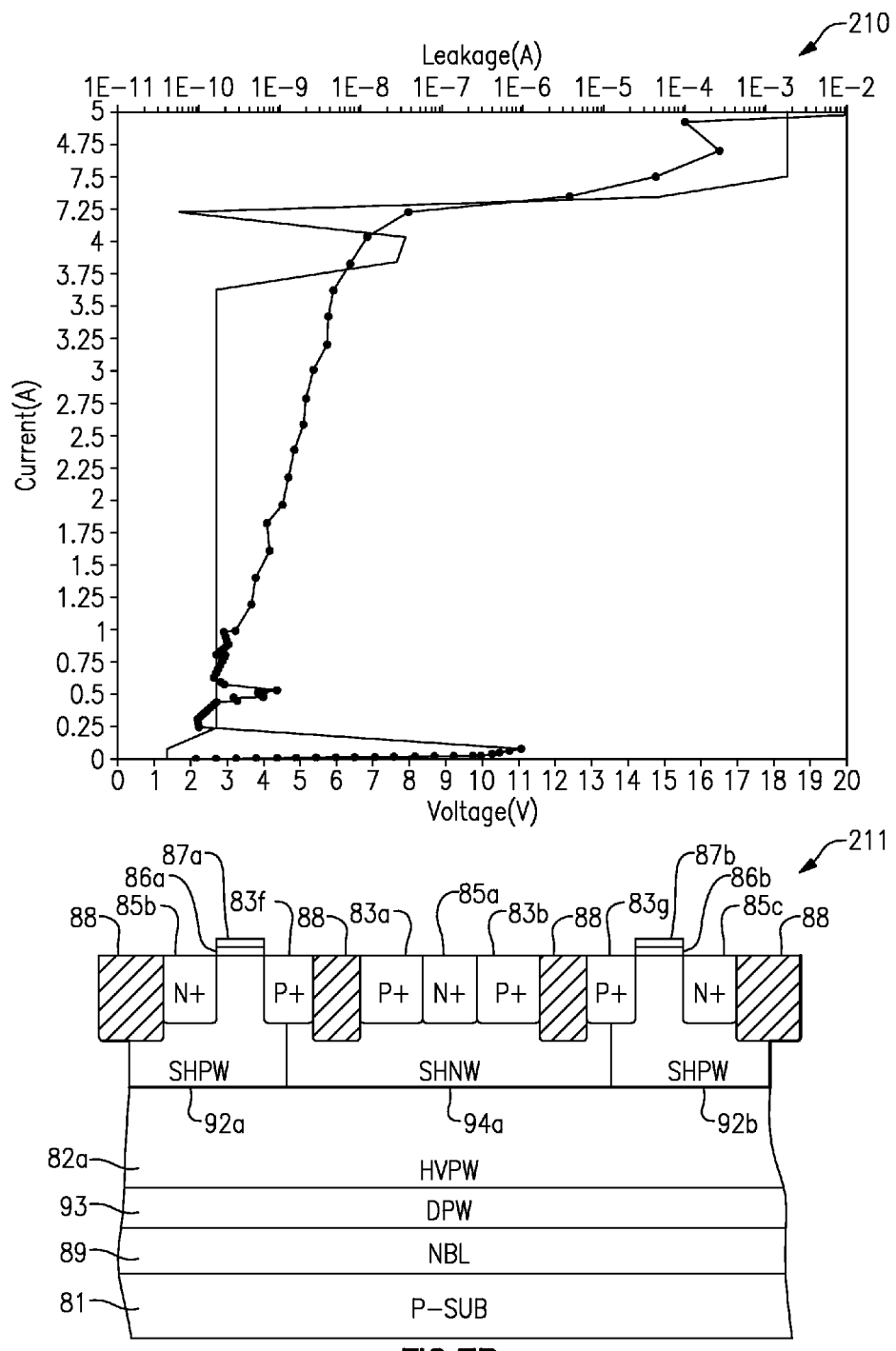

FIG. 7B includes TLP data 210 and a partial cross-section 211 of a dual-tub junction-isolated voltage clamp device. The voltage clamp device shown in the partial cross-section 211 includes a first SHNW 94a, first and second SHPWs 92a, 92b, first and second gate dielectric regions 86a, 86b, first and second gate conductor regions 87a, 87b, first second, sixth and seventh P+ regions 83a-83b, 83f-83g, first to third N+ regions 85a-85c, oxide regions 88, the first HVPW 82a, the DPW 93, the NBL 89, and the P-SUB 81. As shown in FIG. 7B, the NBL 89 is over the P-SUB 81, the DPW 93 is over the NBL 89, and the first HVPW 82a is over the DPW 93. Additionally, the first SHNW 94a and the first and second SHPWs 92a, 92b are in the first HVPW 82a, with the first SHNW 94a positioned between the first and second SHPWs 92a, 92b. The first N+ region 85a and the first and second P+ regions 83a, 83b are disposed in the first SHNW 94a with the first N+ region 85a between the first and second P+ regions 83a, 83b. The second N+ region 85b is disposed in the first SHPW 92a, and the third N+ region 85c is disposed in the second SHPW 92b. The sixth P+ region 83f is disposed along a boundary between the first SHNW 94a and the first SHPW 92a, and the seventh P+ region 83g is disposed along a boundary between the first SHNW 94a and the second SHPW 92B. The first gate dielectric region 86a and the first gate conductor 87a are positioned over a portion of the first SHPW 92a between the second N+ region 85b and the sixth P+ region 83f. The second gate dielectric region 86b and the second gate conductor 87b are positioned over a portion of the second SHPW 92b between the third N+ region 85c and the seventh P+ region 83g.

As shown in the TLP data 210 of FIG. 7B, the voltage clamp device can have a holding voltage of about 2.1 V and a trigger voltage of about 11.2 V. However, other values are possible, such as voltages that depend on geometric structural features and/or fabrication processes.

Figure 7C:
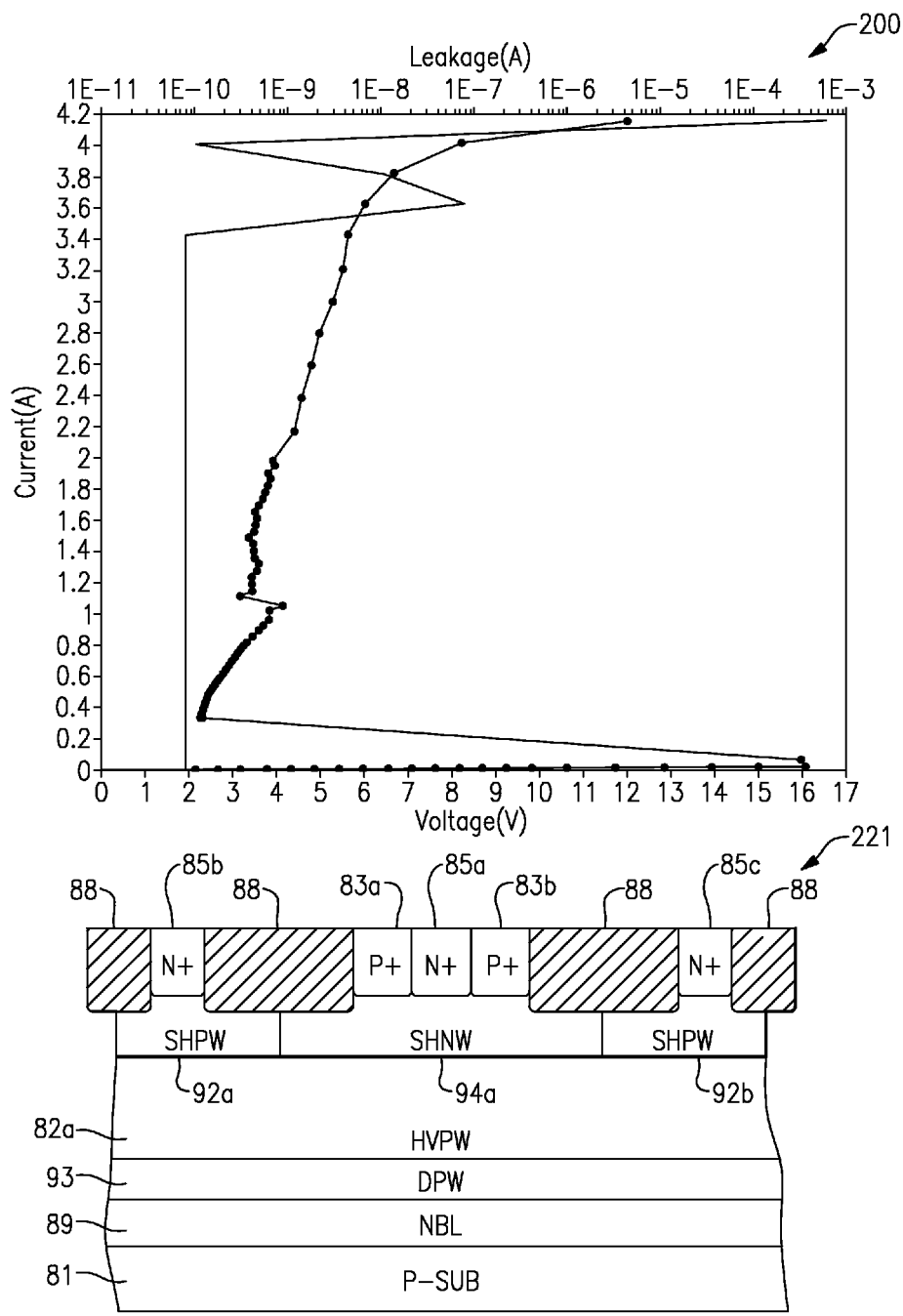

FIG. 7C includes TLP data 220 and a partial cross-section 221 of a dual-tub junction-isolated voltage clamp device similar to that of the voltage clamp device 130 of FIG. 5B. As shown in the TLP data 220 of FIG. 7C, the voltage clamp device can have a holding voltage between about 2 V and 2.5 V and a trigger voltage of about 16.2 V. However, other values are possible, such as voltages that depend on geometric structural features and/or fabrication processes.

Figure 7D:
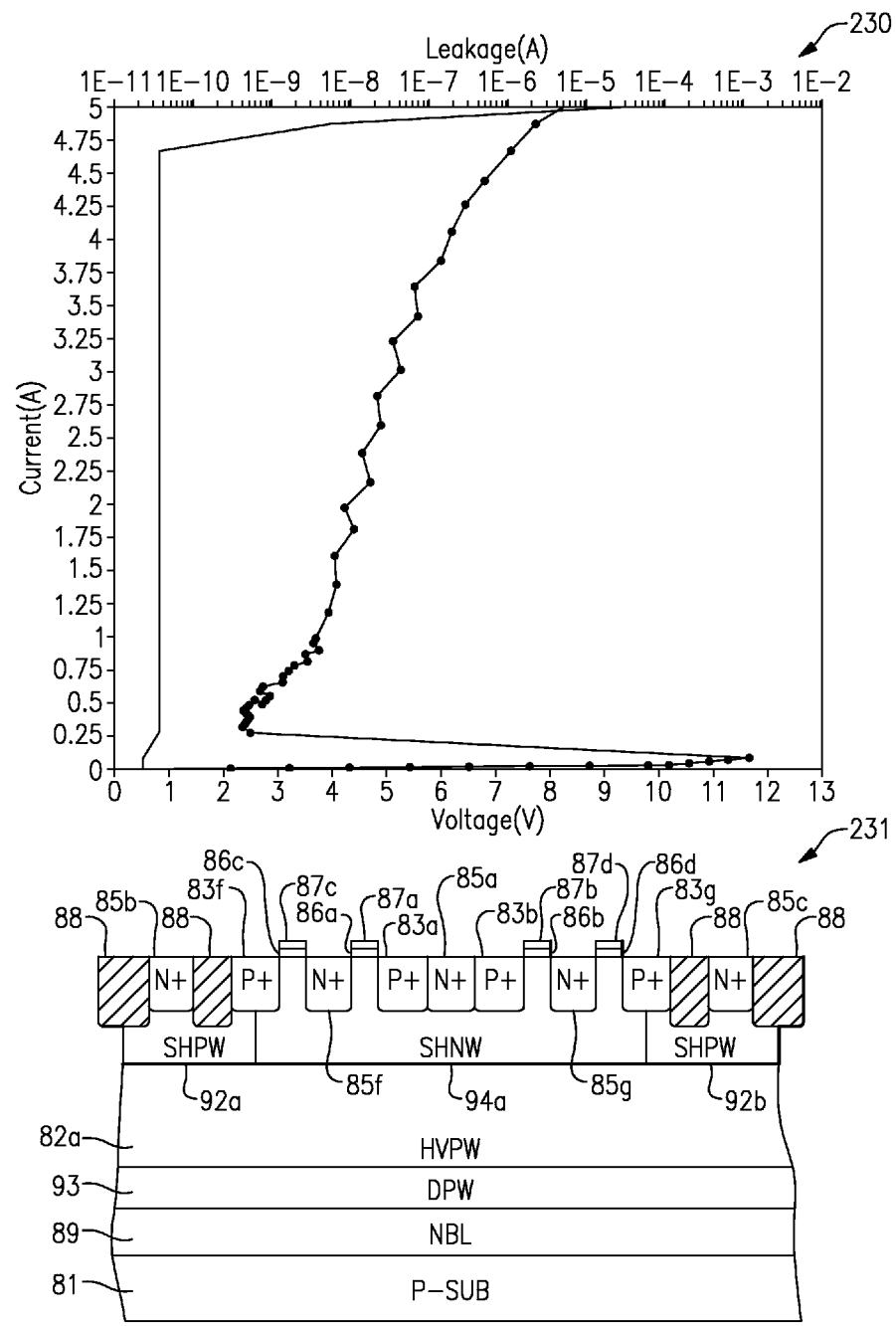

FIG. 7D includes TLP data 230 and a partial cross-section 231 of a dual-tub junction-isolated voltage clamp device similar. The partial cross-section 231 illustrates a PNPN protection structure similar to the PNPN protection structure of the voltage clamp device 80 of FIGS. 2A-2C, except that FIG. 7D illustrates a configuration in which the fifth and sixth gate dielectric regions 86e, 86f and the fifth and sixth gate conductors 87e, 87f have been omitted in favor of using oxide regions 88. As shown in the TLP data 230 of FIG. 7D, the voltage clamp device can have a holding voltage between about 2 V and 2.5 V and a trigger voltage between about 11 V and about 12 V. However, other values are possible, such as voltages that depend on geometric structural features and/or fabrication processes.

Figure 7E:
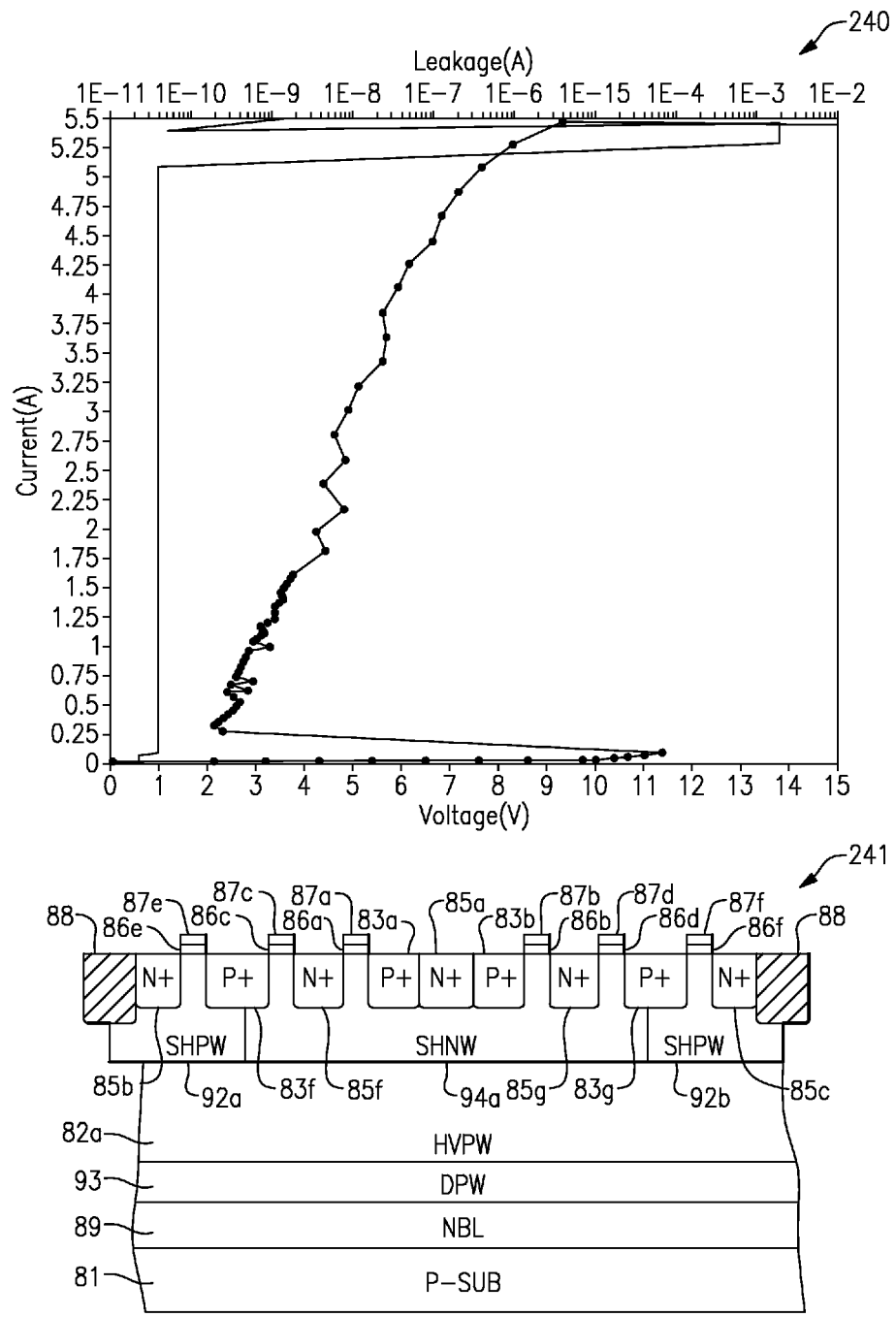

FIG. 7E includes TLP data 240 and a partial cross-section 241 of a dual-tub junction-isolated voltage clamp device similar to that of the voltage clamp device 80 of FIGS. 2A-2C. As shown in the TLP data 240 of FIG. 7E, the voltage clamp device can have a holding voltage between about 2.1 V and a trigger voltage between about 11 V and about 12 V. As compared to the results in FIG. 7D, the trigger and holding voltage of the configuration of FIG. 7E are lower and the current handling capability is higher for a device of about the same dimensions. As shown by a comparison of FIGS. 7D and 7E, the difference in protection characteristics can be associated with the omission of oxide regions 88 between the second N+ region 85b and the sixth P+ region 83f and between the third N+ region 85c and the seventh P+ region 83g in favor of using gate structure 86e-86f, 87e-87f to separate these regions. Although particular holding and trigger voltage data is shown in FIGS. 7D and 7E, other values are possible, such as voltages that depend on geometric structural features and/or fabrication processes.

Figure 8:
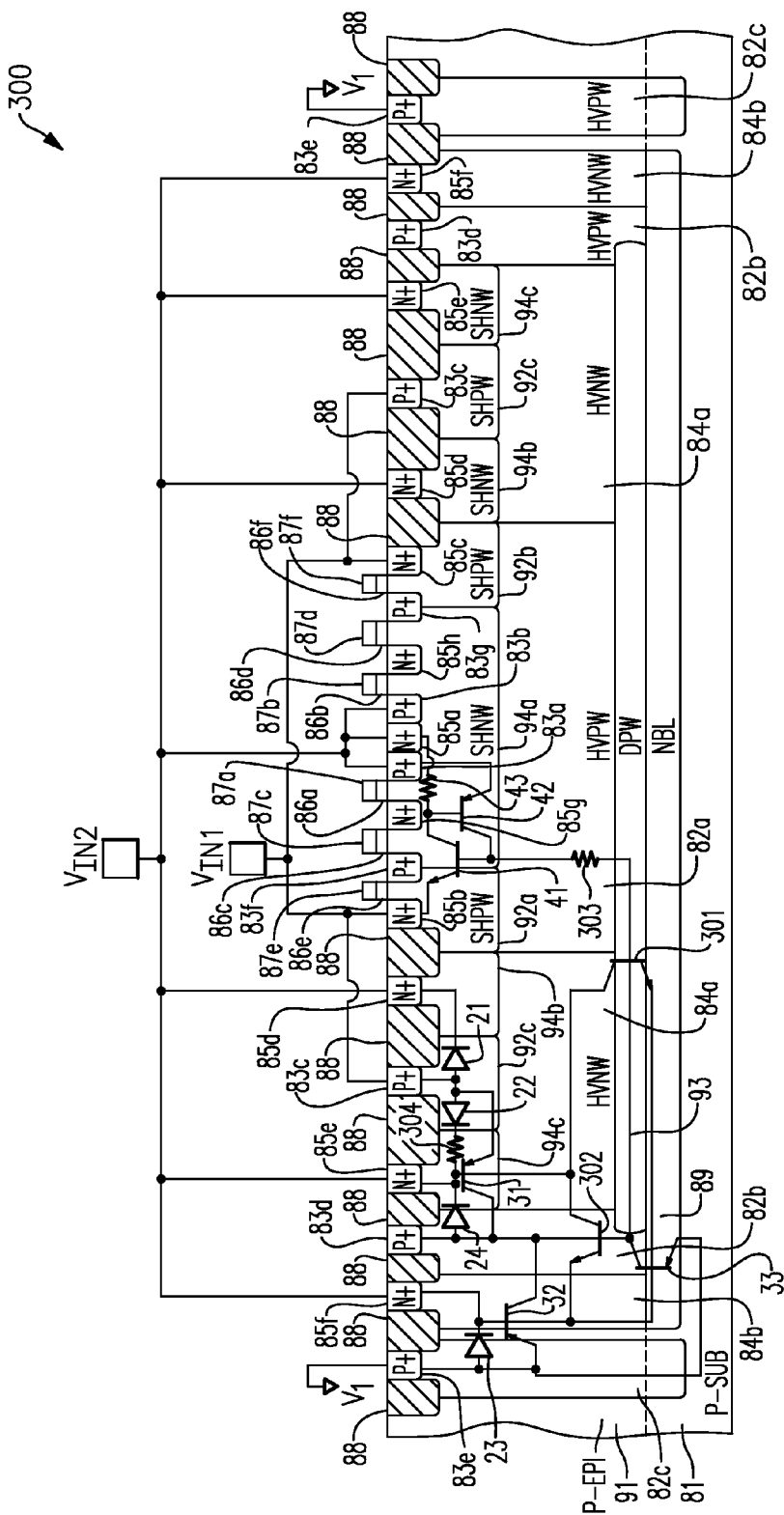
FIG. 8 is another annotated cross section of the dual-tub junction-isolated voltage clamp device of FIGS. 2A-2C.

FIG. 8 is another annotated cross section 300 of the dual-tub junction-isolated voltage clamp device 80 of FIGS. 2A-2C.

The annotated cross section of FIG. 8 is similar to the annotated cross section of FIG. 2C, except that FIG. 8 has been annotated to further include a first NPN parasitic bipolar transistor 301, a second NPN parasitic bipolar transistor 302, a first parasitic resistor 303, and a second parasitic resistor 304.

The first NPN parasitic bipolar transistor 301 includes an emitter associated with the NBL 89, a base associated with the DPW 93, and a collector associated with the first HVNW 84a, and is a vertical bipolar transistor. Additionally, the second NPN parasitic bipolar transistor 302 includes an emitter associated with the second HVNW 84b, a base associated with the second HVPW 82b, and a collector associated with the first HVNW 84a. Furthermore, the first parasitic resistor 303 is associated with the resistance of the first HVPW 82a/DPW 93 between the collector of the PNP thyristor bipolar transistor 42 and the bases of the first and second NPN parasitic bipolar transistors 301, 302. Additionally, the second parasitic resistor 304 is associated with the resistance of the third SHPW 94c/first HVNW 84a between the cathode of the second diode 22 and the base of the first PNP parasitic bipolar transistor 301.

Figure 9:
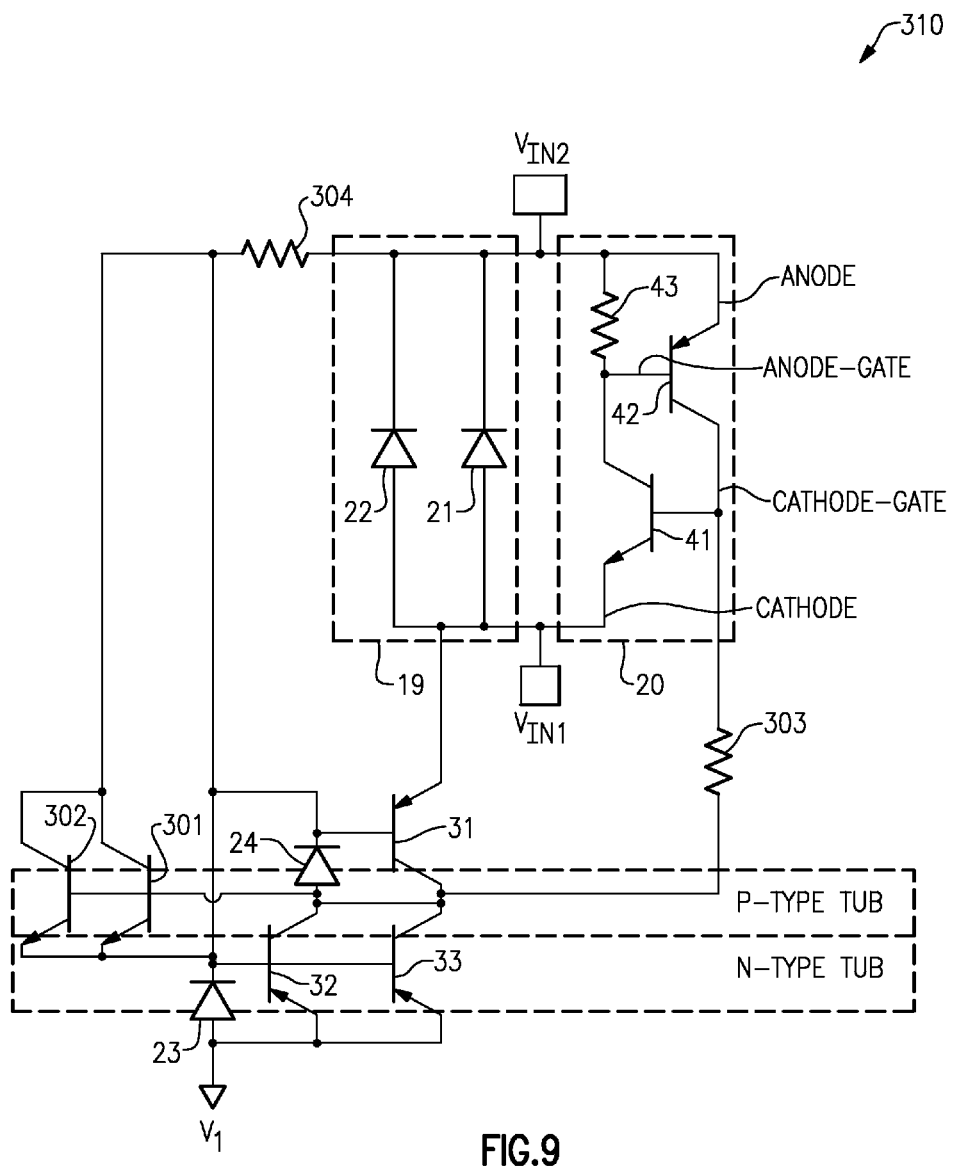
FIG. 9 is another circuit diagram of the dual-tub junction-isolated voltage clamp device of FIGS. 2A-2C.

FIG. 9 is another circuit diagram 310 of the dual-tub junction-isolated voltage clamp device of FIGS. 2A-2C. The circuit diagram 310 of FIG. 9 is similar to the circuit diagram 100 of FIG. 3, except that the circuit diagram 310 further includes the first and second NPN parasitic bipolar transistors 301, 302 and the first and second parasitic resistors 303, 304 described above with reference to FIG. 8.

As shown in FIG. 9, the first parasitic resistor 303 includes a first end electrically connected to the base of the NPN thyristor bipolar transistor 41 and to the collector of the PNP thyristor bipolar transistor 42. Additionally, the first parasitic resistor 303 further includes a second end electrically connected to the collectors of the first to third PNP parasitic bipolar transistors 31-33, to the anode of the fourth diode 24, and to the bases of the first and second NPN parasitic bipolar transistors 301, 302. Furthermore, as shown in FIG. 9, the collectors of the first and second NPN parasitic bipolar transistors 301, 302 are electrically connected to the second pin $V_{IN2}$ through the second parasitic resistor 304. Additionally, the emitters of the first and second NPN parasitic bipolar transistors 301, 302 are electrically connected to the cathode of the third diode 23 and to the bases of the second and third PNP parasitic bipolar transistors 32, 33.

Figure 10:
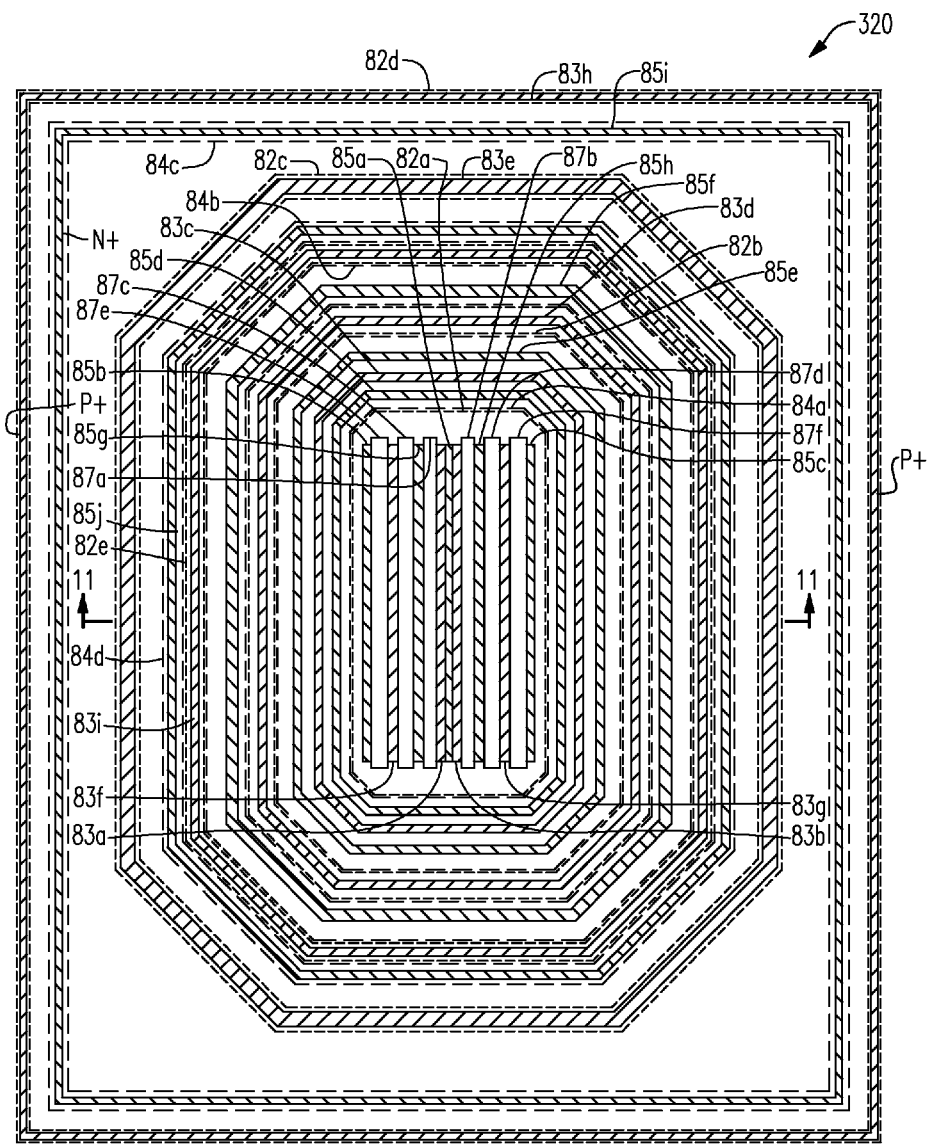
FIG. 10 is a top plan view of a dual-tub junction-isolated voltage clamp device according to another embodiment.

With reference to FIGS. 9 and 10, in certain implementations and/or processes, the first and second NPN parasitic bipolar transistors 301, 302 can have a gain sufficient enough to impact the operation of a voltage clamp device in certain operating conditions. For example, the first and second NPN parasitic bipolar transistors 301, 302 may have a relatively high common-emitter gain or beta (β) when the voltage clamp device is fabricated using a process in which the oxide regions 88 have a relatively shallow depth.

When the NPN parasitic bipolar transistors 301, 302 have a sufficiently high gain, the first PNP parasitic bipolar transistor 31 and the first and/or second NPN parasitic bipolar transistors 301, 302 may be undesirably activated during operation of the voltage clamp device. In certain configurations, the activation of the first PNP parasitic bipolar transistor 31 and the first and/or second NPN parasitic bipolar transistors 301, 302 can be caused in part by forward biasing a path from the first pin $V_{IN1}$ to the second pin $V_{IN2}$ through the emitter-base junction of the PNP parasitic bipolar transistor 31 and to the collectors of the first and second NPN parasitic bipolar transistors 301, 302.

Absent sufficient prevention, the first and second NPN parasitic bipolar transistors 301, 302 can activate during operation, resulting of subsequent injection of residual substrate current through the parasitic substrate PNPs 32, 33. For example, activation of the first and second NPN parasitic bipolar transistors 301, 302 can generate a flow of current into the bases of the second and third PNP parasitic bipolar transistors 32, 33, which can lead to a flow of current to the P-SUB 81. The increased substrate current can generate high power in semiconductor junctions between the n-type tub and the P-SUB 81/P-EPI 91.

Figure 11:
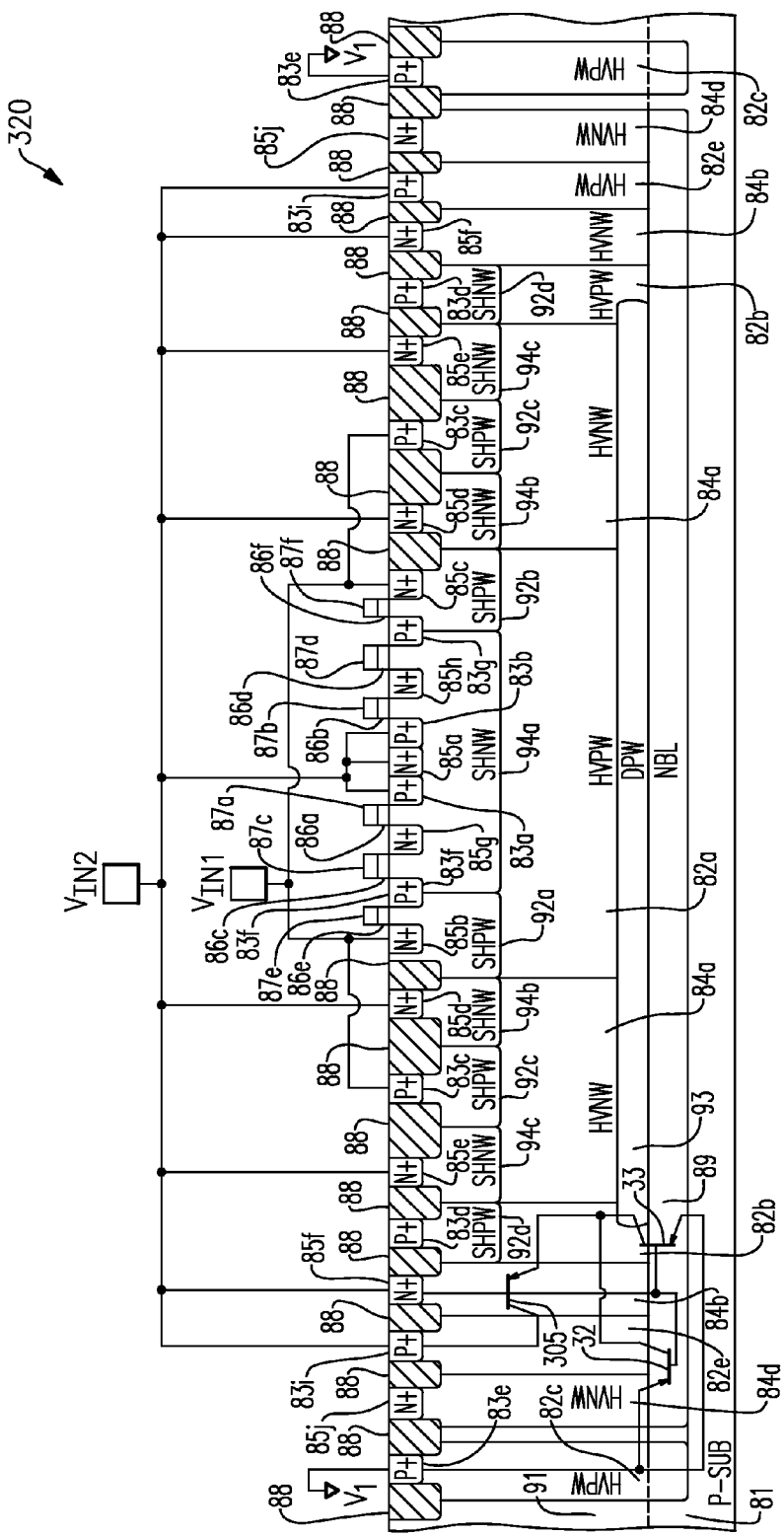
FIG. 11 is a cross section of the dual-tub junction-isolated voltage clamp device of FIG. 10 taken along the lines 11-11.

FIG. 10 is a top plan view of a dual-tub junction-isolated voltage clamp device 320 according to another embodiment. FIG. 11 is a cross section of the dual-tub junction-isolated voltage clamp device 320 of FIG. 10 taken along the lines 11-11.

The voltage clamp device 320 of FIGS. 10 and 11 is similar to the voltage clamp device 80 of FIGS. 2A-2C, except that the voltage clamp device 320 further includes a fifth HVPW 82e, a fourth HVNW 82d, a ninth P+ region 83i, a tenth N+ region 85j, and a fourth SHPW 92d.

In the illustrated configuration, the fifth HVPW 82e abuts and surrounds the second HVNW 84b. Additionally, the fourth HVNW 82d abuts and surrounds the fifth HVPW 82e. Furthermore, the NBL 89 extends beneath the fifth HVPW 82e and the fourth HVNW 84d so as to electrically isolate the fifth HVPW 82e from the P-SUB 81. Additionally, the third HVPW 82c surrounds but is spaced apart from the fourth HVNW 84d. The eighth P+ region 83i is disposed in the fifth HVPW 82e, and is electrically connected to the second pin $V_{IN2}$. The ninth N+ region 85j is disposed in the fourth HVNW 84d. In the illustrated configuration, the ninth N+ region 85j is electrically floating. Additionally, the fourth SHPW 92d is disposed in the second HVPW 82b, and in the illustrated configuration has a width that is about the same as a width of the second HVPW 82b.

The fifth HVPW 82e operates as an embedded p-type guard well that surrounds the second HVNW 84b, which is associated with the device's n-type tub. Additionally, the fourth HVNW 84d operates as an embedded n-type collector guard well surrounding the fifth HVPW 82e.

Including the fifth HVPW 82e and the fourth HVNW 84d can aid in reducing substrate current injection, such as current injected by the second and third PNP parasitic bipolar transistors 32, 33. For example, the fifth HVPW 82e and the fourth HVNW 84d can operate to increase a base width of the second PNP bipolar transistor 32, thereby reducing the gain and current injection of the second PNP bipolar transistor 32. Additionally, FIG. 11 has been annotated to include the embedded PNP bipolar guard ring transistor 305, which can have an emitter associated with the second HVPW 82b, a base associated with the fourth HVNW 84d, and a collector associated with the fifth HVPW 82e.

As shown in FIG. 11, the base and collector of the embedded PNP bipolar guard ring transistor 305 can be electrically connected to the second pin $V_{IN2}$, while the emitter of the PNP lateral bipolar guard ring transistor 305 can be electrically connected to the collectors of the second and third PNP parasitic bipolar transistors 32, 33. The embedded PNP bipolar guard ring transistor 305 can operate to reduce in-situ the flow of current into the collectors of the second and third PNP parasitic bipolar transistors 32, 33, and thus can reduce the amount of current injected into the substrate. The PNP bipolar guard ring transistor 305 can also provide a current path between the first pin $V_{IN1}$ and the second pin $V_{IN2}$, and thus can be used to encourage current flow confined within the isolation of the voltage clamp device 320.

The voltage clamp device 320 also includes the fourth SHPW 92d, which can operate to decrease the gain of the second and third parasitic PNP bipolar transistors 32, 33.

The widths of the second HVNW 84b, the fifth HVPW 82e, and/or the fourth HVNW 84d can be selected to be relatively large so as to decrease the gain of the second PNP parasitic bipolar transistor 32. For example, in one embodiment, a width of the second HVNW 84b is selected to be in the range of about 3.0 μm to about 6.0 μm, for instance, 5.5 μm, a width of the fifth HVPW 82e is selected to be in the range of about 4.0 μm to about 8.0 μm, for instance, 6.0 μm, and a width of the fourth HVNW 84d is selected to be in the range of about 10 μm to about 40 μm, for instance 15 μm. Although one example of well widths has been provided, other configurations are possible.

Figure 12:
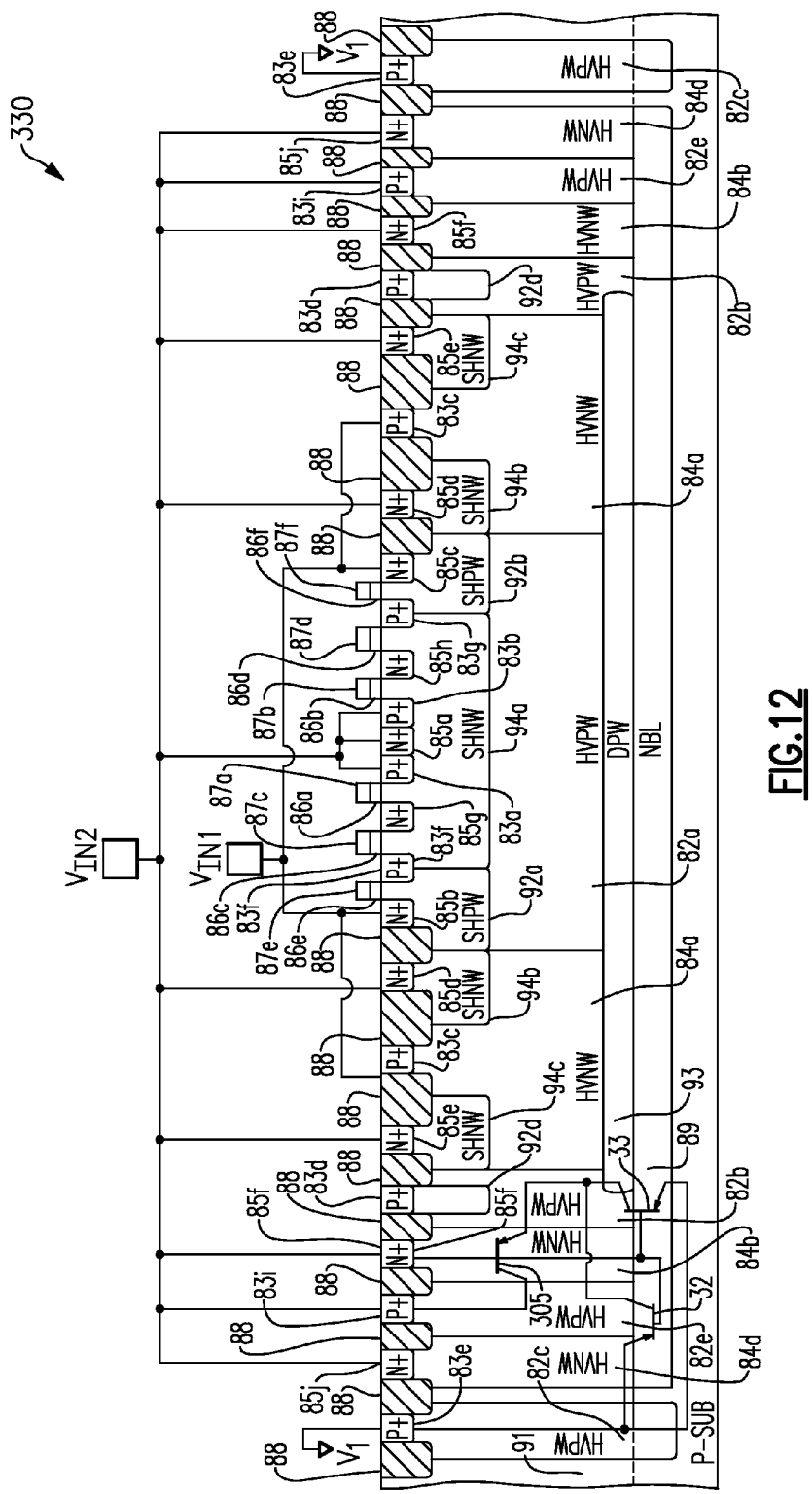
FIG. 12 is a cross section of another embodiment of a dual-tub junction-isolated voltage clamp device.

FIG. 12 is a cross section of another embodiment of a dual-tub junction-isolated voltage clamp device 330. The voltage clamp device 330 of FIG. 12 is similar to the voltage clamp device 320 of FIG. 11, except that the voltage clamp device 330 illustrates a configuration in which the third SHPW 92c has been omitted, in which the fourth SHPW 92d has a narrower width than the second HVPW 82b, and in which the tenth N+ region 85j is electrically connected to the second pin $V_{IN2}$.

Omitting the third SHPW 92c can aid in decreasing the gain of the first PNP parasitic bipolar transistor 31 by increasing the transistor's base width, thereby helping to prevent activation of the first PNP parasitic bipolar transistor 31 and the first and/or second NPN parasitic bipolar transistors 301, 302 shown in FIG. 9.

As shown in FIG. 12, the fourth SHPW 92d has been configured to have a width that is less than a width of the second HVPW 82b. In one embodiment, the fourth SHPW 92d has a width that is 1 μm to 2 μm smaller than a width of the second HVPW 82b. Although one example of well widths has been provided, other implementations are possible. Configuring the fourth SHPW 92d in this manner can help prevent the fourth SHPW 92d from significantly impacting the blocking voltage between the second HVPW 82b and the first and fourth HVNWs 84a, 84d. However, even with a narrower width, the fourth SHPW 92d can still help to decrease the gain of the second and third parasitic PNP bipolar transistors 32, 33.

In the illustrated configuration, the tenth N+ region 85j is electrically connected to the second pin $V_{IN2}$. Connecting the tenth N+ region 85j in this manner can increase the breakdown of the second and third PNP parasitic bipolar transistors 32, 33 and help mitigate the risk of the second and third PNP parasitic bipolar transistors 32, 33 from activating. Although FIG. 12 illustrates a configuration in which the tenth N+ region 85j is electrically connected to the second pin $V_{IN2}$, in certain implementations the tenth N+ region 85j of the voltage clamp device 330 of FIG. 12 can be electrically floating in a manner similar to that shown for the configuration of FIG. 11. Furthermore, although FIG. 11 illustrates a configuration in which the tenth N+ region 85j is electrically floating, in certain implementations the tenth N+ region 85j of the voltage clamp device 320 of FIG. 11 can be electrically connected to the second pin $V_{IN2}$.

In the embodiments described above, the protections devices can include layers, regions, and/or wells having n-type or p-type dopants. In other embodiments, the doping types of all the layers, regions, and wells of the voltage clamp devices can be opposite to those described and shown in the above embodiments, and the same principles and advantages can still apply to the other embodiments. For example, a complementary version of the voltage clamp device of FIGS. 2A-2C can be formed using an n-type substrate and n-type epitaxial layer and by reversing the doping polarity of the wells, active regions, and buried layers formed therein. Similarly, complementary versions of the voltage clamp devices shown in FIGS. 4A-7E are also possible under the same principle described above.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described above, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described above.

Applications

Devices employing the above described protection schemes can be implemented into various electronic devices and interface applications. Examples of the electronic devices can include, but are not limited to, consumer electronic products, parts of the consumer electronic products, electronic test equipment as well as high robustness industrial and automotive applications, among other applications in the semiconductor industry. Examples of the electronic devices can also include circuits of optical networks or other communication networks and circuits for voltage reference and electrical cars battery power management. The electronic products can include, power management integrated circuits for cell phones, base stations, a vehicle engine management controller, a transmission controller, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for providing protection from transient electrical events, the apparatus comprising:
   a first terminal;
   a second terminal;
   a first p-type well region;
   a PNPN protection structure fully disposed in the first p-type well region, wherein the PNPN protection structure includes an anode electrically connected to the second terminal and a cathode electrically connected to the first terminal;
   a first n-type well region adjacent the first p-type well region;
   a PN diode protection structure disposed in the first n-type well region, wherein the PN diode protection structure includes an anode electrically connected to the first terminal and a cathode electrically connected to the second terminal;
   a p-type tub configured to surround the first p-type well region and the first n-type well region; and
   an n-type tub configured to surround the p-type tub,
   wherein the p-type tub is electrically floating, and
   wherein the n-type tub is electrically connected to the second terminal.

2. The apparatus of claim 1, further comprising an embedded p-type guard well surrounding the n-type tub and an embedded n-type guard well surrounding the p-type guard well, wherein the embedded p-type guard well is electrically connected to the second terminal, wherein the n-type tub comprises an n-type buried layer, wherein the n-type buried layer extends beneath the embedded p-type guard well and the embedded n-type guard well.

3. The apparatus of claim 2, wherein the embedded n-type guard well is electrically connected to the second terminal.

4. The apparatus of claim 2, wherein the p-type tub comprises a second p-type well region and a shallow p-type well disposed in the second p-type well region.

5. The apparatus of claim 4, wherein a width of the shallow p-type well is less than a width of the second p-type well region.

6. The apparatus of claim 1, further comprising a p-type substrate and a p-type epitaxial layer disposed over the p-type substrate, wherein the first p-type well region and the first n-type well region are disposed in the p-type epitaxial layer.

7. The apparatus of claim 6, wherein the n-type tub comprises an n-type buried layer disposed in the p-type substrate and a second n-type well region disposed in the p-type epitaxial layer, wherein the second n-type well region is electrically connected to the second terminal.

8. The apparatus of claim 7, wherein the p-type tub comprises a second p-type well region disposed in the p-type epitaxial layer and a deep p-type well disposed in the p-type epitaxial layer, wherein the second p-type well region is positioned between the first n-type well region and the second n-type well region, and wherein a portion of the deep p-type well is positioned between the n-type buried layer and the first n-type well region.

9. The apparatus of claim 1, wherein the p-type tub further comprises a shallow p-type well disposed in a second p-type well region, wherein the shallow p-type well is spaced from a boundary between the second p-type well region and the first n-type well region, and wherein the shallow p-type well region is spaced from a boundary between the second p-type well region and the second n-type well region.

10. The apparatus of claim 1, wherein the PNPN protection structure further comprises an anode-gate, wherein the anode-gate is electrically connected to the second terminal through a resistor.

11. An apparatus for providing protection from transient electrical events, the apparatus comprising:
   a first terminal;
   a second terminal;
   a first p-type well region;
   a PNPN protection structure fully disposed in the first p-type well region, wherein the PNPN protection structure includes an anode electrically connected to the second terminal and a cathode electrically connected to the first terminal;
   a first n-type well region adjacent the first p-type well region;
   a PN diode protection structure disposed in the first n-type well region, wherein the PN diode protection structure includes an anode electrically connected to the first terminal and a cathode electrically connected to the second terminal;
   a p-type tub configured to surround the first p-type well region and the first n-type well region;
   an n-type tub configured to surround the p-type tub,
   wherein the p-type tub is electrically floating, and
   wherein the n-type tub is electrically connected to the second terminal;
   a shallow p-type well disposed in the first p-type well region;
   a shallow n-type well disposed in the first p-type well region adjacent the shallow p-type well;
   a first p-type active region disposed in the shallow n-type well, wherein the first p-type active region operates as the anode of the PNPN protection structure;
   a first n-type active region disposed in the shallow n-type well adjacent the first p-type active region, wherein the first p-type active region and the first n-type active region are electrically connected to the second terminal; and
   a second n-type active region disposed in the shallow p-type well, wherein the second n-type active region operates as the cathode of the PNPN protection structure, wherein the second n-type active region is electrically connected to the first terminal.

12. The apparatus of claim 11, wherein the PNPN protection structure further comprises:
   a third n-type active region disposed along a boundary between the shallow p-type well and the shallow n-type well; and
   a first gate structure adjacent a portion of the shallow n-type well between the first p-type active region and the third n-type active region.

13. The apparatus of claim 12, wherein the PNPN protection structure further comprises:
   an oxide region positioned between the third n-type active region and the second n-type active region.

14. The apparatus of claim 12, wherein the PNPN protection structure further comprises:
   a second p-type active region disposed in the shallow p-type well, wherein the second p-type active region is positioned between the second n-type active region and the third n-type active region;
   a second gate structure adjacent a portion of the shallow p-type well between the second p-type active region and the third n-type active region; and a third gate structure adjacent a portion of the shallow p-type well between the second p-type active region and the second n-type active region.

15. The apparatus of claim 11, wherein the PNPN protection structure further comprises:
   a third n-type active region disposed in the shallow n-type well;
   a first gate structure adjacent a portion of the shallow n-type well between the first p-type active region and the third n-type active region.

16. The apparatus of claim 15, wherein the PNPN protection structure further comprises:
   a second p-type active region disposed along a boundary between the shallow p-type well and the shallow n-type well;
   a second gate structure adjacent a portion of the shallow n-type well between the second p-type active region and the third n-type active region; and
   a third gate structure adjacent a portion of the shallow p-type well between the second p-type active region and the second n-type active region.

17. The apparatus of claim 15, wherein the PNPN protection structure further comprises:
   an oxide region positioned between the third n-type active region and the second n-type active region.

18. The apparatus of claim 11, wherein the first n-type active region comprises an anode-gate region including a first plurality of island regions disposed in the first p-type active region, wherein the plurality of island regions extend along a first direction.

19. The apparatus of claim 1, wherein the PN diode protection structure comprises:
   a shallow p-type well disposed in the first n-type well region;
   a first shallow n-type well disposed in the first n-type well region adjacent the shallow p-type well, wherein the first shallow n-type well is positioned between the shallow p-type well and the first p-type well region;
   a first p-type active region disposed in the shallow p-type well, wherein the first p-type active region is electrically connected to the first terminal; and
   a first n-type active region disposed in the first shallow n-type well, wherein the first n-type active region is electrically connected to the second terminal.

20. The apparatus of claim 19, wherein the PN diode protection structure further comprises:
   a second shallow n-type well disposed in the first n-type well region adjacent a side of the shallow p-type well opposite the first shallow n-type well; and
   a second n-type active region disposed in the second shallow n-type well, wherein the second n-type active region is electrically connected to the second terminal.

21. A method of making a protection device, the method comprising:
   forming a first p-type well region;
   forming a first n-type well region adjacent the first p-type well region;
   forming a p-type tub that surrounds the first p-type well region and the first n-type well region;
   forming an n-type tub that surrounds the p-type tub;
   forming a PNPN protection structure fully disposed in the first p-type well region, wherein the PNPN protection structure includes a cathode electrically connected to a first terminal and an anode electrically connected to a second terminal; and
   forming a PN diode protection structure in the first n-type well region, wherein the PN diode protection structure includes an anode electrically connected to the first terminal and a cathode electrically connected to the second terminal;
   wherein the p-type tub is electrically floating, and
   wherein the n-type tub is electrically connected to the second terminal.

22. The method of claim 21, further forming an embedded p-type guard well surrounding the n-type tub and forming an embedded n-type guard well surrounding the p-type guard well, wherein the embedded p-type guard well is electrically connected to the second terminal, wherein the n-type tub comprises an n-type buried layer, wherein the n-type buried layer extends beneath the embedded p-type guard well and the embedded n-type guard well.

23. The method of claim 22, wherein the embedded n-type guard well is electrically connected to the second terminal.

24. The method of claim 22, wherein the p-type tub comprises a second p-type well region and a shallow p-type well disposed in the second p-type well region.

25. The method of claim 24, wherein a width of the shallow p-type well is less than a width of the second p-type well region.

* * * * *